(12) United States Patent
Ning et al.

(10) Patent No.: US 8,435,845 B2
(45) Date of Patent: May 7, 2013

(54) JUNCTION FIELD EFFECT TRANSISTOR WITH AN EPITAXIALLY GROWN GATE STRUCTURE

(75) Inventors: Tak H. Ning, Yorktown Heights, NY (US); Kangguo Cheng, Guilderland, NY (US); Ali Khakifirooz, Slingerlands, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/080,690

(22) Filed: Apr. 6, 2011

(65) Prior Publication Data

US 2012/0256238 A1  Oct. 11, 2012

(51) Int. Cl.
*H01L 21/337* (2006.01)
(52) U.S. Cl.
USPC .............. 438/186; 438/188; 438/194
(58) Field of Classification Search .......... 438/186, 438/188, 194, 195
See application file for complete search history.

(56) References Cited

U.S. PATENT DOCUMENTS

| | | | |
|---|---|---|---|
| 6,821,851 B2 | 11/2004 | Hergenrother et al. | |
| 7,534,706 B2* | 5/2009 | Boyd | 438/574 |
| 7,943,971 B1* | 5/2011 | Kapoor et al. | 257/256 |
| 2010/0006823 A1 | 1/2010 | Anderson et al. | |

* cited by examiner

*Primary Examiner* — Kevin M Picardat
(74) *Attorney, Agent, or Firm* — Scully, Scott, Murphy & Presser, P.C.; H. Daniel Schnurmann

(57) ABSTRACT

A method of fabricating a semiconductor device that includes forming a replacement gate structure on a portion of a semiconductor substrate, wherein source regions and drain regions are formed in opposing sides of the replacement gate structure. A dielectric is formed on the semiconductor substrate having an upper surface that is coplanar with an upper surface of the replacement gate structure. The replacement gate structure is removed to provide an opening to an exposed portion of the semiconductor substrate. A functional gate conductor is epitaxially grown within the opening in direct contact with the exposed portion of the semiconductor substrate. The method is applicable to planar metal oxide semiconductor field effect transistors (MOSFETs) and fin field effect transistors (finFETs).

22 Claims, 11 Drawing Sheets

JUNCTION FIELD EFFECT TRANSISTOR WITH AN EPITAXIALLY GROWN GATE STRUCTURE

BACKGROUND

The present disclosure relates generally to semiconductor devices. More particularly, the present disclosure relates to scaling of semiconductor devices.

The integration of electronic microchip devices, such as resistors, capacitors, fuses, diodes and transistors on a silicon substrate is the basis for integrated circuit (IC) wafer fabrication technology. The most popular IC technology, complementary metal-oxide semiconductor (CMOS), revolves around the improvements that have been made in field effect transistor (FET) design and fabrication. Two basic types of FET are the metal-oxide semiconductor field effect transistor (MOSFET) and the junction field effect transistor (JFET). In order to be able to make ICs, one has to find ways to further downscale the dimensions of FETs, such as MOSFETs and CMOS devices. Scaling achieves compactness and improves operating performance in devices by shrinking the overall dimensions and operating voltages of the device while maintaining the device's electrical properties.

SUMMARY

A method of fabricating a junction field effect transistor (JFET) is provided that forms a functioning gate conductor using an epitaxial growth process, in which the gate conductor has a uniform doping concentration. In one embodiment, the method of forming the JFET includes forming a replacement gate structure on a portion of a semiconductor substrate. A source region and a drain region are formed in the semiconductor substrate on opposing sides of the replacement gate structure. A dielectric is formed on the semiconductor substrate having an upper surface that is coplanar with an upper surface of the replacement gate structure. The replacement gate structure is removed to provide an opening to an exposed portion of the substrate. A functional gate conductor is epitaxially formed within the opening in direct contact with the exposed portion of the substrate.

In another embodiment, a method of forming a Schottky field effect transistor (FET) is provided that includes a replacement gate process to form the functional gate structure of the device. In one embodiment, the method includes forming a replacement gate structure on a portion of a semiconductor substrate. A source region and a drain region are formed on opposing sides of the portion of the semiconductor substrate that the replacement gate structure is present on. A dielectric is formed on the semiconductor substrate having an upper surface that is coplanar with an upper surface of the replacement gate structure. The replacement gate structure is removed to provide an opening to an exposed portion of the semiconductor substrate. A metal gate conductor is deposited within the opening in direct contact with the exposed portion of the semiconductor substrate.

In another embodiment, a method is provided for forming a JFET and a MOSFET on the same semiconductor substrate. In one embodiment, the method includes forming a first replacement gate structure on a first portion of a semiconductor substrate, and a second replacement gate structure on a second portion of the semiconductor substrate. In one embodiment, a first source region and a first drain region are formed in the semiconductor substrate on opposing sides of the first replacement gate structure, and a second source region and a second drain region are formed in the semiconductor substrate on opposing sides of the second replacement gate structure. A dielectric is formed on the semiconductor substrate having an upper surface that is coplanar with an upper surface of the first replacement gate structure and the second replacement gate structure.

The first replacement gate structure is removed to provide a first opening to an exposed portion of the first portion of the semiconductor substrate. A functional gate conductor is epitaxially grown within the first opening in direct contact with the exposed portion of the semiconductor substrate to provide a JFET in the first portion of the semiconductor substrate. The second replacement gate structure is removed to provide a second opening to an exposed portion of the second portion of the semiconductor substrate. A functional gate structure is formed within the second opening. The functional gate structure includes a gate dielectric that is in direct contact with the exposed portion of the second portion of the semiconductor substrate to provide a MOSFET in the second portion of the semiconductor substrate.

In yet another embodiment, the present disclosure provides a method of forming a fin field effect transistor (finFET) device, in which the gate structure of the finFET device is formed using an epitaxial growth process, and has a uniform doping concentration. In one embodiment, the method of fabricating a finFET device includes providing a fin structure, and forming a replacement gate structure atop a first portion of the fin structure. Source and drain regions are formed in the fin structure on a second portion of the fin structure that is present on opposing sides of the first portion of the fin structure that the replacement gate structure is present on. A dielectric is formed having an upper surface that is coplanar with an upper surface of the replacement gate structure. The replacement gate structure is removed to provide an opening to expose the first portion of the fin structure. A functional gate conductor is epitaxially grown within the opening in direct contact with the first portion of the fin structure.

In another aspect, a semiconductor device structure is provided. In one embodiment, a JFET is provide that includes a semiconductor substrate including a channel region of a first conductivity dopant having a first concentration, and a source region and a drain region on opposing sides of the channel region. The source region and the drain region each have a second concentration of the first conductivity dopant that is greater than the first concentration of the first conductivity dopant in the channel region. A gate conductor of an epitaxial semiconductor material is in direct contact with the channel region of the semiconductor substrate, wherein the epitaxial semiconductor material has the same crystal structure as the semiconductor substrate. The epitaxial semiconductor material comprises a second conductivity dopant that is uniform in concentration throughout an entirety of the gate conductor.

In another embodiment, a finFET semiconductor device is provided that includes a fin structure including first conductivity source and drain regions on opposing sides of a first conductivity channel region. The concentration of the first conductivity dopant in the source and drain regions is higher than the concentration of the first conductivity dopant in the channel region. A gate conductor composed of an epitaxial semiconductor material is in direct contact with the first conductivity channel region of the fin structure. The epitaxial semiconductor material has the same crystal structure as the fin structure. The epitaxial semiconductor material includes a second conductivity dopant that is uniform in concentration throughout an entirety of the gate conductor.

In another embodiment, a Schottky gate field effect transistor (JFET) is provided that includes a semiconductor substrate including a channel region of a first conductivity dopant having a first concentration, and a source region and a drain region on opposing sides of the channel region. The source region and the drain region each have a second concentration of the first conductivity dopant that is greater than the first concentration of the first conductivity dopant in the channel region. A gate conductor composed of metal material is in direct contact with the channel region of the semiconductor substrate.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
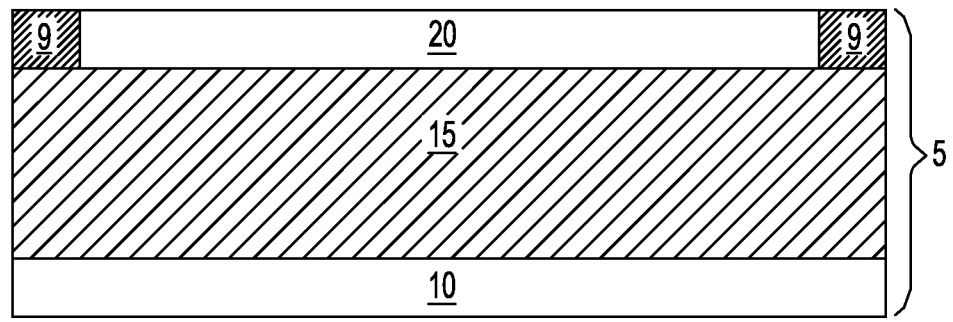
FIG. 1 is a side cross-sectional view of one embodiment of a semiconductor substrate suitable for forming a junction field effect transistor (JFET), in accordance with the present disclosure.

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a junction field effect transistor (JFET), and a method of forming thereof, that includes an epitaxially formed gate conductor, and an abrupt gate conductor/channel junction. In one embodiment, the method disclosed herein also provides a method of forming a gate conductor that is self-aligned to the channel region and a source region and a drain region (collectively the "source region" and the "drain region" may be referred to as a "source and drain region"). In yet another embodiment, the method may also provide for the integration of JFET devices and metal oxide semiconductor field effect transistors (MOSFETs) device with minimal increases in the number of process steps for forming the MOSFETs.

A field effect transistor (FET) is a semiconductor device in which output current, i.e., source-drain current, is controlled by the voltage applied to a gate structure. A FET has three terminals, i.e., a functional gate structure, a source region and a drain region. The functional gate structure controls output current, i.e., flow of carriers in the channel region. The channel region is the region between the source region and the drain region of the transistor that becomes conductive when the transistor is turned on. A p-type field effect transistor (pFET) is a transistor in which the source and drain regions of the device are doped with a p-type dopant. An n-type field effect transistor (nFET) is a transistor in which the source and drain regions of the device are doped with an n-type dopant.

A JFET is a transistor in which the functional gate structure is provided by a gate conductor that is in direct contact with the channel region of a semiconductor substrate. Contrary to a JFET that includes a gate conductor in direct contact with the channel region of a semiconductor substrate, a MOSFET is a transistor having a gate structure that includes a gate conductor and a gate dielectric, wherein the gate dielectric is positioned between the gate conductor and the channel region of a semiconductor substrate.

FIGS. 1-5 depict one embodiment of a method of forming a JFET 100, in which the gate conductor of the JFET 100 is composed of an epitaxial material. By "epitaxial material" or "epitaxially formed material" it is meant that the semiconductor material of the gate conductor has the same crystalline orientation as the semiconductor structure that the gate conductor is in direct contact with, e.g., the channel region of the semiconductor substrate that the gate conductor is in direct contact with.

FIG. 1 illustrates the results of initial processing steps that produce a semiconductor on insulator (SOI) substrate 5 that includes at least a semiconductor on insulator (SOI) layer 20 overlying a dielectric layer 15, wherein the SOI layer 20 has a thickness of 10 nm or less. A base semiconductor layer 10 may be present underlying the dielectric layer 15. The SOI layer 20 may comprise any semiconducting material including, but not limited to Si, strained Si, SiC, SiGe, SiGeC, Si alloys, Ge, Ge alloys, GaAs, InAs, and InP, or any combination thereof.

The SOI layer 20 may be thinned to a desired thickness by planarization, grinding, wet etch, dry etch, oxidation followed by oxide etch, or any combination thereof. One method of thinning the SOI layer 20 is to oxidize the Si by a thermal dry or wet oxidation process, and then wet etch the oxide layer using a hydrofluoric acid mixture. This process can be repeated to achieve the desired thickness. In one embodiment, the SOI layer 20 has a thickness ranging from 1.0 nm to 10.0 nm. In another embodiment, the SOI layer 20 has a thickness ranging from 1.0 nm to 5.0 nm. In a further embodiment, the SOI layer 20 has a thickness ranging from 3.0 nm to 8.0 nm.

The SOI layer 20 may be doped with an n-type or p-type conductivity dopant. As used herein, "p-type" refers to the addition of impurities to an intrinsic semiconductor that creates deficiencies of valence electrons. In a silicon containing SOI layer 20, examples of n-type dopants include, but are not limited to boron, aluminum, gallium and indium. As used herein, "n-type" refers to the addition of impurities that contributes free electrons to an intrinsic semiconductor. In a silicon containing SOI layer 20 examples of n-type dopants include, but are not limited to antimony, arsenic and phosphorous.

The base semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The dielectric layer 15 that may be present underlying the SOI layer 20 and atop the base semiconductor layer 10 may be formed by implanting a high-energy dopant into the SOI substrate 5 and then annealing the structure to form a buried insulating layer, i.e., dielectric layer 15. In another embodiment, the dielectric layer 15 may be deposited or grown prior to the formation of the SOI layer 20. In yet another embodiment, the substrate 5 may be formed using wafer-bonding techniques, where a bonded wafer pair is formed utilizing glue, an adhesive polymer, or direct bonding.

In one embodiment, the SOI substrate 5 includes an isolation region 9 for separating semiconductor devices of different conductivities. In one embodiment, the isolation region 9 is formed by forming a trench in at least the SOI substrate 5 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD). The depth of the isolation region 9 may vary from that illustrated in FIG. 1.

Figure 2:
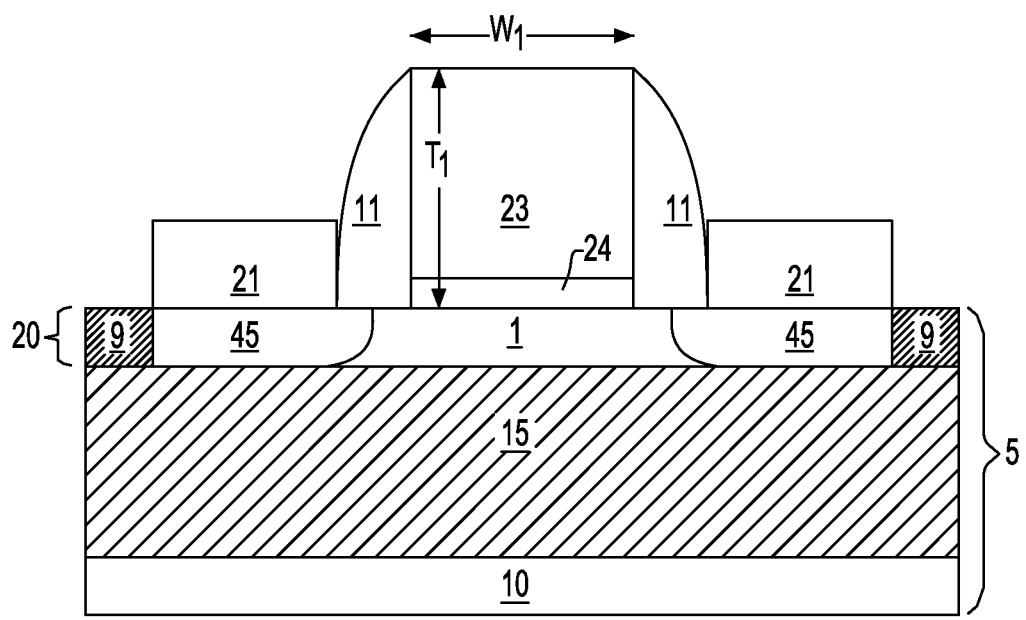
FIG. 2 is a side cross-sectional view of one embodiment of forming a replacement gate structure on a portion of a semiconductor substrate, and forming a source region and a drain region in the semiconductor substrate and on opposing sides of the replacement gate structure, in accordance with the present disclosure.

FIG. 2 depicts one embodiment of forming a replacement gate structure 25 on a portion of the SOI substrate 5, and forming a source region and a drain region in the SOI substrate 5 and on opposing sides of the replacement gate structure 25. The replacement gate structure 25 includes a sacrificial material that defines the geometry of a later formed functional gate structure that functions to switch the semiconductor device from an "on" to "off" state, and vice versa. In one embodiment, and as illustrated in FIG. 2, the replacement gate structure 25 includes a sacrificial material stack on the SOI substrate 5, in which the sacrificial material stack may be composed of a plurality of layers of sacrificial material. For example, the sacrificial material stack of the replacement gate structure 25 may include a sacrificial dielectric layer 24 that is present on the SOI substrate 5, and a sacrificial gate material 23 that is present on the sacrificial dielectric layer 24. In another embodiment (not shown), the replacement gate structure 25 may be composed of a single layer of sacrificial material.

The sacrificial dielectric layer 24 of the replacement gate structure 25 may be composed of any dielectric material, such as an oxide, nitride, or oxynitride material. In one embodiment, the composition of the sacrificial dielectric layer 24 is selected so that the sacrificial dielectric is removed by an etch that is selective to the underlying portion of the SOI substrate 5. The sacrificial dielectric layer 24 may be formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The sacrificial dielectric layer 24 may also be deposited using evaporation, chemical solution deposition, spin on deposition, and physical vapor deposition (PVD) methods. In another embodiment, the sacrificial dielectric layer 24 may be formed using a growth process, such as thermal oxidation or nitridation. In one example, the sacrificial dielectric layer 24 is composed of silicon oxide.

In one embodiment, the sacrificial gate material 23 of the replacement gate structure 25 may be composed of a semiconductor-containing material, such as a silicon-containing material. Silicon-containing materials that are suitable for the replacement gate structure 25 include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the sacrificial gate material 23 is amorphous silicon. In some embodiments, other materials, such as dielectrics and metals, can be employed as the sacrificial material of the sacrificial semiconductor material 23, so long as the material selected can be removed selective to the substrate 10 and the subsequently formed dielectric.

The sacrificial gate material 23 may be formed using a deposition process, such as CVD. Variations of CVD processes suitable for forming the sacrificial gate material 23 include, but not limited to, APCVD, LPCVD, PECVD, MOCVD and combinations thereof may also be employed. The sacrificial gate material 23 may also be deposited using evaporation, chemical solution deposition, spin on deposition, and PVD methods.

In one embodiment, the sacrificial dielectric layer 24 and the sacrificial gate material 23 may blanket deposited on the upper surface of the SOI substrate 5 to provide a sacrificial material stack. The sacrificial material stack may be patterned and etched to provide the replacement gate structure 25. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 100:1.

In one embodiment, the etch process removes the exposed portions of the sacrificial material stack with an etch chemistry that is selective to the SOI substrate 5. In another embodiment, the etch process that forms the replacement gate structure 25 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used include ion beam etching, plasma etching or laser ablation.

The width W1 of the replacement gate structure 25 may range from 20 nm to 250 nm. In another embodiment, the width W1 of the replacement gate structure 25 may range from 50 nm to 150 nm. In yet another embodiment, the width W1 of the replacement gate structure 25 may range from 80 nm to 100 nm. The thickness T1 of the replacement gate structure 25 may range from 50 nm to 500 nm. In another embodiment, the thickness T1 of the replacement gate structure 25 may range from 100 nm to 200 nm. In yet another embodiment, the thickness T1 of the replacement gate structure 25 may range from 125 nm to 175 nm.

First spacers 11 can be formed in direct contact with the sidewalls of the replacement gate structure 25. The first spacers 11 are typically narrow having a width, as measured from its base, ranging from 2.0 nm to 15.0 nm. The first spacer 11 can be formed using deposition and etch processing steps. The first spacer 11 may be composed of a dielectric, such as nitride, oxide, oxynitride, or a combination thereof. The thickness of the first spacer 11 determines the proximity of the subsequently formed raised source/drain (RSD) regions to the channel of the device.

FIG. 2 depicts one embodiment of forming an in-situ doped semiconductor material 21 on exposed surfaces of the SOI layer 20 that are adjacent to the replacement gate structure 25. In one embodiment, the in-situ doped semiconductor material 21 is formed using an epitaxial growth process. When the chemical reactants are controlled and the system parameters set correctly, the depositing atoms arrive at the surface of the SOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 450° C. to 900° C. Although higher temperature typically results in faster deposition, the faster deposition may result in crystal defects and film cracking.

In one embodiment, the in-situ doped semiconductor material 21 may be provided by selective-epitaxial growth of SiGe atop the SOI layer 20. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in the portion of the SOI layer 20, in which the channel of a semiconductor device, such as a pFET device, is subsequently formed.

In one embodiment, the in-situ doped semiconductor material 21 is doped with a first conductivity type dopant during the epitaxial growth process. In one embodiment, the in-situ doped semiconductor material 21 provides a raised source region and a drain region of a semiconductor device. P-type MOSFET devices are produced by doping the in-situ doped semiconductor material 21 with elements from group III of the Periodic Table of Elements. In one embodiment, the group III element is boron, aluminum, gallium or indium. In one example, in which the in-situ doped semiconductor material 21 is doped to provide a p-type conductivity, the dopant may be boron present in a concentration ranging from $1\times10^{18}$ atoms/cm$^3$ to $2\times10^{21}$ atoms/cm$^3$. In one example, the in-situ doped semiconductor material 21 is composed of SiGe and is doped with boron to provide the raised source and drain regions of a p-type conductivity field effect transistor. As used herein, the term "raised" in combination with source and/or drain denotes that the source and/or drain region is formed on a semiconductor material layer that is present on an upper surface of the substrate on which the gate dielectric is present.

In another embodiment, the in-situ doped semiconductor material 21 is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the SOI layer 20, in which the channel of a semiconductor device, such as a nFET device, is subsequently formed.

In one embodiment, the in-situ doped semiconductor material 21 is doped with a second conductivity type dopant during the epitaxial growth process. In one embodiment, the in-situ semiconductor material 21 provides the raised source and drain regions of a semiconductor device, in which n-type MOSFET devices are produced by doping the in-situ doped semiconductor material 21 with elements from group V of the Periodic Table of Elements. In one embodiment, the group V element is phosphorus, antimony or arsenic.

FIG. 2 also depicts one embodiment of diffusing dopant from the in-situ doped semiconductor material 21 into the SOI layer 20 to form extension regions 45. The extension regions 45 are a component of the source and drain regions. In one embodiment, the dopant from the in-situ doped semiconductor material 21 is diffused into the SOI layer 20 by an annealing processes including, but not limited to, rapid thermal annealing, furnace annealing, flash lamp annealing, laser annealing, or any suitable combination of thereof. In one embodiment, thermal annealing to diffuse the dopant from the in-situ doped semiconductor material 21 into the SOI layer 20 is conducted at a temperature ranging from 850° C. to 1350° C.

In one embodiment, in which in-situ doped semiconductor material 21 is doped to a p-type conductivity, the extension regions 45 that are formed in the SOI layer 20 have a p-type conductivity. Typically, the dopant concentration of the extension regions 45 having the p-type conductivity ranges from $1\times10^{19}$ atoms/cm$^3$ to $2\times10^{21}$ atoms/cm$^3$. In another embodiment, the extension regions 45 have the p-type conductivity ranging from $2\times10^{19}$ atoms/cm$^3$ to $5\times10^{20}$ atoms/cm$^3$.

In another embodiment, in which the in-situ doped semiconductor material 21 is doped to an n-type conductivity, the extension regions 45 that are formed in the SOI layer 20 have an n-type conductivity. Typically, the dopant concentration of the extension regions 45 having the n-type conductivity ranges from $1\times10^{19}$ atoms/cm$^3$ to $2\times10^{21}$ atoms/cm$^3$. In another embodiment, the extension regions 45 have the p-type conductivity ranging from $2\times10^{19}$ atoms/cm$^3$ to $5\times10^{20}$ atoms/cm$^3$.

In one embodiment, the extension regions 45 have a depth that extends the entire depth of the SOI layer 20. Therefore, the extension regions 45 have a depth of less than 10 nm, typically being 3 nm to 8 nm in depth, as measured from the upper surface of the SOI layer 20. In another embodiment, the extension regions 45 may be implanted into the SOI substrate 5 using ion implantation prior to the formation of the raised source region and the raised drain region, collectively referred to herein after as raised source and drain regions. Similarly, the dopant may be introduced to the raised source and drain regions using ion implantation. In this embodiment, the semiconductor material for the raised source and drain region is first deposited, and is then doped within ion implantation after formation.

The portion of the SOI layer 20 that is present between the extension regions 45 is the channel region 1 of the device. Typically, the channel region 1 of the JFET has the same conductivity type as the extension regions 45. For example, when the extension regions 45 of the source and drain regions are doped to an n-type dopant, the channel region 1 of the SOI layer 20 is also doped to an n-type dopant. In another example, when the extension regions 45 of the source and drain regions are doped to a p-type dopant, the channel region 1 of the SOI layer 20 is also doped to a p-type dopant. The concentration of the dopant in the extension regions 45 of the source and drain regions is greater than the concentration of the dopant in the channel region 1 of the SOI layer 20. For example, the concentration of the dopant in the extension regions 45 of the source and drain regions may range from $5\times10^{19}$ atoms/cm$^3$ to $5\times10^{21}$ atoms/cm$^3$, and the concentration of the dopant in the channel region 1 of the SOI layer 20 may range from $5\times10^{17}$ atoms/cm$^3$ to $4\times10^{19}$ atoms/cm$^3$. In another example, the concentration of the dopant in the extension regions 45 of the source and drain regions may range from $1\times10^{20}$ atoms/cm$^3$ to $5\times10^{20}$ atoms/cm$^3$, and the concentration of the dopant in the channel region 1 of the SOI layer 20 may range from $3\times10^{18}$ atoms/cm$^3$ to $1\times10^{19}$ atoms/cm$^3$.

Figure 3:
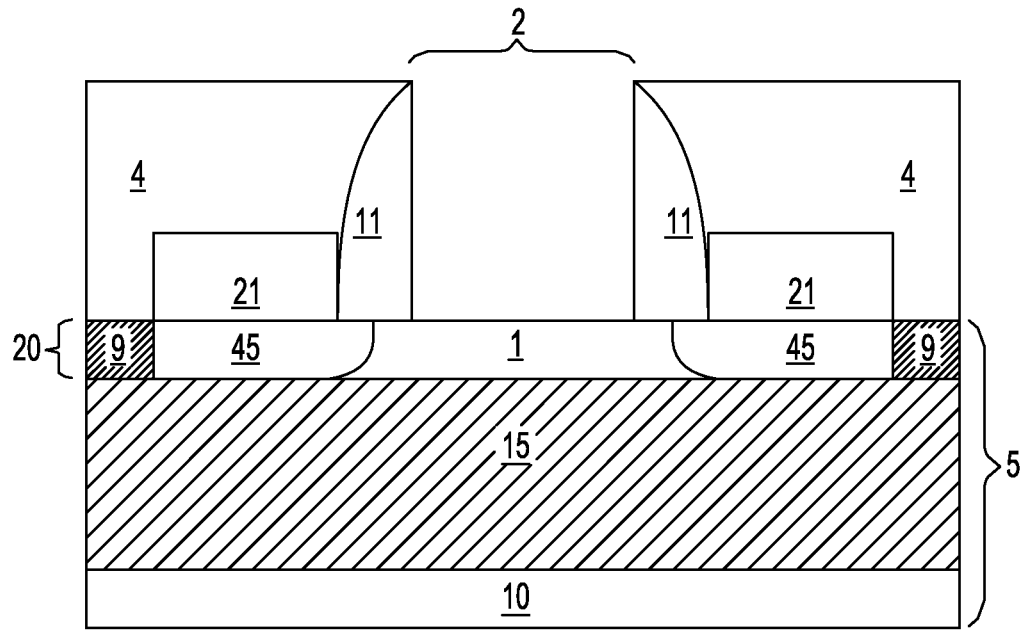
FIG. 3 is a side cross-sectional view of one embodiment of forming a dielectric on the semiconductor substrate having an upper surface that is coplanar with an upper surface of the replacement gate structure, and removing the replacement gate structure to provide an opening to an exposed portion of the semiconductor substrate, in accordance with the present disclosure.

Referring to FIG. 3, a dielectric 4 is formed on the SOI substrate 5 having an upper surface that is coplanar with an upper surface of the replacement gate structure 25. The dielectric 4 may be blanket deposited atop the entire SOI substrate 5 and planarized. The blanket dielectric may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the dielectric 4 include any of the aforementioned materials in porous form, or in a form that changes during processing to or from being porous and/or permeable to being non-porous and/or non-permeable.

The dielectric 4 may be formed using a deposited process, such as CVD. Variations of CVD processes that are suitable for forming the dielectric layer 4 include, but are not limited to, APCVD, LPCVD, PECVD, MOCVD and combinations thereof may also be employed. The dielectric 4 may also be deposited using evaporation, chemical solution deposition, spin on deposition, and PVD methods.

Following deposition, the dielectric 4 may be planarized so that the upper surface of the dielectric 4 is coplanar with the upper surface of the replacement gate structure 25. Planarization is a material removal process that employs at least mechanical forces, such as frictional media, to produce a planar surface. The dielectric layer 4 may be planarized using chemical mechanical planarization (CMP). Chemical mechanical planarization (CMP) is a material removal process using both chemical reactions and mechanical forces to remove material and planarize a surface.

FIG. 3 depicts one embodiment of removing the replacement gate structure 25 to provide an opening 2 to an exposed portion of the SOI substrate 5. The replacement gate structure 25 is typically removed using a selective etch process that removes the replacement gate structure 25 selective to the SOI substrate 5, the first spacers 11 and the dielectric 4. The etch may be an isotropic etch or an anisotropic etch. The anisotropic etch may include reactive-ion etching (RIE). Other examples of anisotropic etching that can be used include ion beam etching, plasma etching or laser ablation. In comparison to anisotropic etching, isotropic etching is non-directional. One example of an isotropic etch is a wet chemical etch.

In one embodiment, the sacrificial dielectric layer 24 and the sacrificial gate material 23 of the replacement gate structure 25 are removed using a single etch chemistry. In another embodiment, a first etch chemistry removes the sacrificial gate material 23 selectively to the sacrificial dielectric layer 24, and a second etch chemistry removes the sacrificial dielectric layer 24 selectively to the SOI layer 20 of the SOI substrate 5. In one embodiment, in which the sacrificial gate material 23 of the replacement gate structure 25 is composed of polysilicon, the first spacers 11 are composed of silicon oxide ($SiO_2$), the dielectric 4 is composed of silicon oxide ($SiO_2$), and the sacrificial gate dielectric 24 is composed of silicon oxide ($SiO_2$), the wet etch chemistry for removing the sacrificial gate material 23 may be composed of an etch solution containing ammonia ($NH_4OH$) or TetraMethyl Ammonium Hydroxide (TMAH), followed by an etch solution containing hydrofluoric (HF) acid. In one embodiment, in which the sacrificial gate material 23 is composed of silicon nitride, the sacrificial dielectric layer of the replacement gate structure 25 is composed of silicon oxide ($SiO_2$), the SOI substrate 5 is a silicon-containing material, the first spacers 11 are composed of silicon oxide ($SiO_2$), and the dielectric 4 is composed of silicon oxide ($SiO_2$), the wet etch chemistry for removing the sacrificial gate material 23 may be composed of an etch solution containing hot phosphoric acid.

Figure 4:
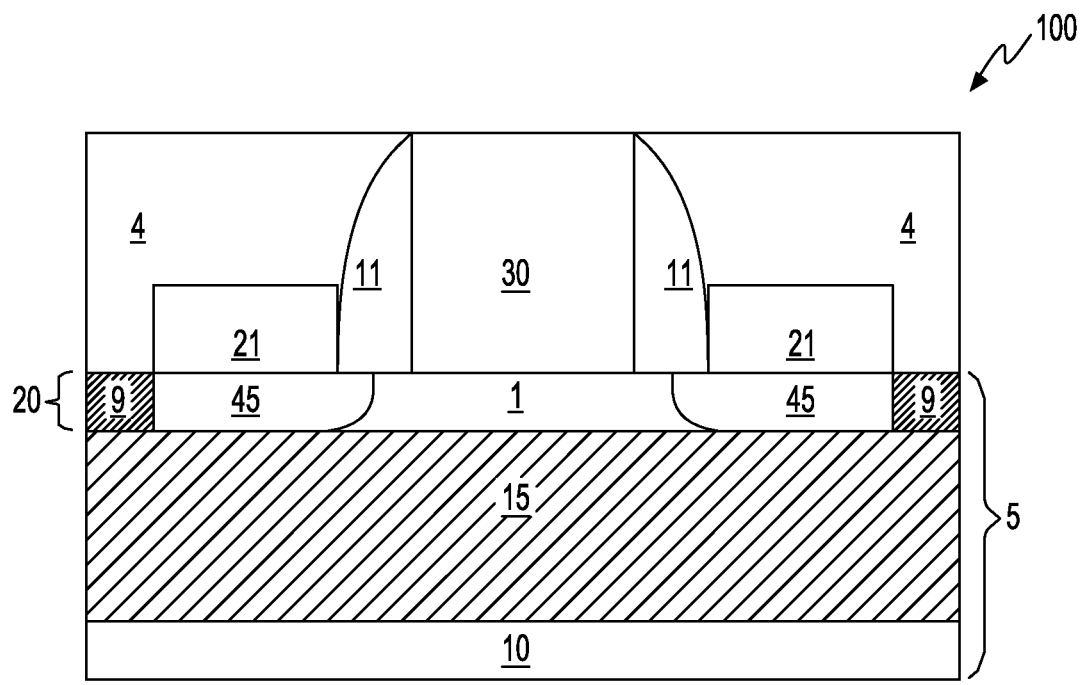
FIG. 4 is a side cross-sectional view of epitaxially forming a functional gate conductor within the opening in direct contact with the exposed portion of the semiconductor substrate, in accordance with the present disclosure.

FIG. 4 depicts one embodiment of epitaxially forming a functional gate conductor 30 within the opening 2 in direct contact with the exposed portion of the SOI substrate 5. The functional gate conductor 30 is formed in direct contact with the upper surface of the SOI layer 20 that contains the channel region 1 of the device. In one embodiment, the functional gate conductor 30 is formed using an epitaxial growth process. When the chemical reactants are controlled and the system parameters set correctly, the depositing atoms arrive at the surface of the SOI layer 20 with sufficient energy to move around on the surface and orient themselves to the crystal arrangement of the atoms of the deposition surface. Thus, an epitaxial film deposited on a {100} crystal surface will take on a {100} orientation. Therefore, the functional gate conductor 30 has the same crystalline orientation as the channel region 1 of the SOI layer 20.

In one embodiment, the functional gate conductor 30 is composed of a silicon containing material, such as single crystal silicon or polycrystalline silicon. A number of different sources may be used for the deposition of epitaxial silicon. Silicon sources for epitaxial growth of silicon include silicon tetrachloride, dichlorosilane ($SiH_2Cl_2$), and silane ($SiH_4$). The temperature for epitaxial silicon deposition typically ranges from 450° C. to 900° C. Although higher temperature typically results in faster deposition, the faster deposition may result in crystal defects and film cracking. In another embodiment, the functional gate conductor 30 may be provided by epitaxial growth of SiGe atop the channel region 1 of the SOI layer 20. The Ge content of the epitaxial grown SiGe may range from 5% to 60%, by atomic weight %. In another embodiment, the Ge content of the epitaxial grown SiGe may range from 10% to 40%. Besides SiGe, the functional gate conductor 30 may be composed of silicon doped with carbon (Si:C), III-V compound semiconductor (e.g., gallium arsenic), II-VI compound semiconductor, and combinations thereof.

The functional gate conductor 30 is doped to a conductivity type that is opposite the conductivity type of the channel region 1 of the SOI layer 20. As used herein, the term "conductivity type" denotes a semiconductor device being p-type or n-type. Therefore, if the channel region 1 of the SOI layer 20 is doped to an n-type conductivity, the functional gate conductor 30 is doped to a p-type conductivity. The dopant is introduced to the functional gate conductor 30 using an in-situ doping process. As used herein, "in-situ doping" means that the dopant atoms are introduced into the semiconductor material during the semiconductor materials growth. Typically, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, the gaseous dopant sources for in-situ doping include $PH_3$, $B_2H_6$, $AsH_3$ and combinations thereof.

P-type conductivity functional gate conductors 30 are produced by in-situ doping a functional gate conductor 30 composed of silicon containing material with elements from group III of the Periodic Table of Elements. In one embodiment, the group III element is boron, aluminum, gallium or indium. In one example, in which the functional gate conductors 30 is doped to a p-type conductivity, the p-type dopant may be present in a concentration ranging from $1 \times 10^{18}$ atoms/cm$^3$ to $2 \times 10^{21}$ atoms/cm$^3$. In another example, in which the functional gate conductors 30 is doped to provide a p-type conductivity, the p-type dopant may be present in a concentration ranging $5 \times 10^{19}$ atoms/cm$^3$ to $1 \times 10^{21}$ atoms/cm$^3$.

In one embodiment, in which the functional gate conductors 30 is doped to an n-type conductivity, the dopant may be provided by elements from group V of the Periodic Table of Elements. In one embodiment, the group V element is phosphorus, antimony or arsenic. In one example, in which the functional gate conductors 30 is doped to an n-type conductivity, the n-type dopant may be present in a concentration ranging from $1\times10^{18}$ atoms/cm$^3$ to $2\times10^{21}$ atoms/cm$^3$. In another example, in which the functional gate conductors 30 is doped to provide an n-type conductivity, the n-type dopant may be present in a concentration ranging from $5\times10^{19}$ atoms/cm$^3$ to $1\times10^{21}$ atoms/cm$^3$.

The dopant that provides the conductivity of the functional gate conductor 30 is uniform in concentration throughout the entirety of the functional gate conductor 30. The difference between the highest dopant concentration and the lowest dopant concentration, measured by secondary ion mass spectrometry (SIMS) is less than 10%. In one example, the dopant concentration at the base of the functional gate conductor 30 that is in direct contact with the channel region 1 of the SOI layer 20 is equal to a dopant concentration at an upper surface of the functional gate conductor 30.

Further, in some embodiments, the epitaxially formed functional gate conductor 30 provides an abrupt junction at the interface between the functional gate conductor 30 and the channel region 1 of the SOI layer 20. In one embodiment, the junction abruptness, i.e., dopant concentration change at the gate/channel junction, is less than 3 nm/decade. In another embodiment, the junction abruptness ranges from 2.5 nm/decade to 0.25 nm/decade. In yet another embodiment, the junction abruptness ranges from 2.0 nm/decade to 0.50 nm/decade. In one example, the junction abruptness is 2.0 nm/decade or less.

Figure 5:
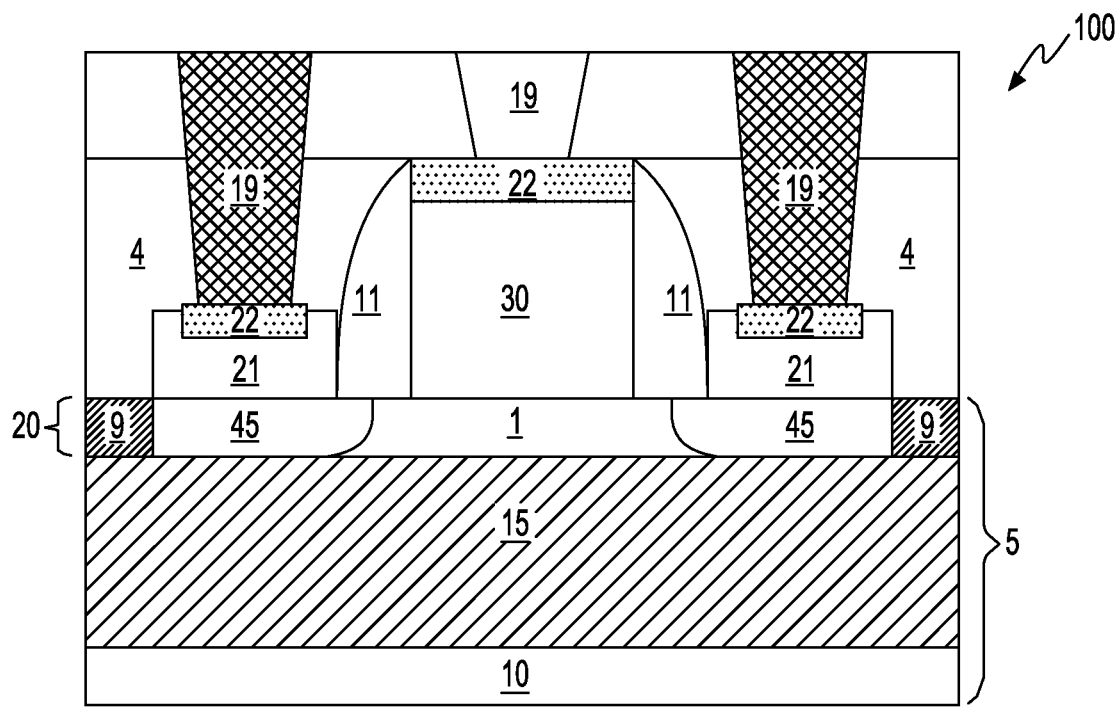
FIG. 5 is a side cross-sectional view of forming interconnects to the functional gate conductor and the source and drain regions, in accordance with the present disclosure.

FIG. 5 depicts one embodiment of forming interconnects 19 to the functional gate conductor 30 and the source and drain regions. In one embodiment, prior to Ruining the interconnects 19, metal semiconductor alloys 22 are formed on the source and drain regions of the device, i.e., the in-situ doped semiconductor material 21. In one embodiment, the metal semiconductor alloy is provided by a silicide. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining non-reacted metal is removed by an etch process selective to silicide. A gate silicide may also be formed on the gate conductor.

The interconnects 19 may be formed through an dielectric layer 3 and the dielectric 4 to the source and drain regions and the functional gate conductor 30. The dielectric layer 3 may be selected from the group consisting of silicon containing materials such as SiO$_2$, Si$_3$N$_4$, SiO$_x$N$_y$, SiC, SiCO, SiCOH, and SiCH compounds; the above-mentioned silicon containing materials with some or all of the Si replaced by Ge; carbon doped oxides; inorganic oxides; inorganic polymers; hybrid polymers; organic polymers such as polyamides or SiLK™; other carbon containing materials; organo-inorganic materials such as spin-on glasses and silsesquioxane-based materials; and diamond-like carbon (DLC, also known as amorphous hydrogenated carbon, α-C:H). Additional choices for the dielectric layer 3 include: any of the aforementioned materials in porous form, or in a form that changes during processing to or from being porous and/or permeable to being non-porous and/or non-permeable. The dielectric layer 3, and the dielectric 4, are then patterned and etched to form via holes to the various source/drain region and the functional gate conductor 30 of the device. Following via formation, interconnects 19 are formed by depositing a conductive metal into the via holes using deposition methods, such as CVD or plating. The conductive metal may include, but is not limited to: tungsten, copper, aluminum, silver, gold and alloys thereof.

Figure 6:
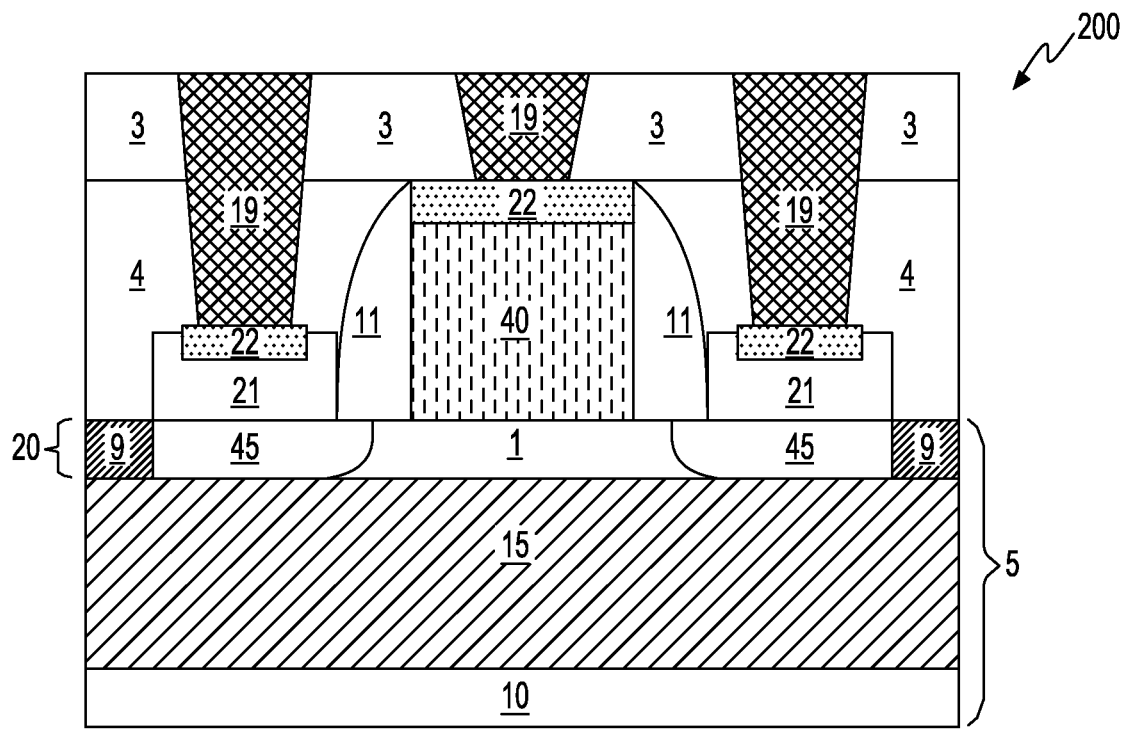
FIG. 6 is a side cross-sectional view of a Schottky field effect transistor (FET) including a metal gate conductor formed using a replacement gate process, in accordance with the present disclosure.

FIG. 6 depicts one embodiment of a Schottky gate field effect transistor 200, in which the functional gate structure of the device is formed using a replacement gate process. The term "Schottky gate" describes a FET, in which the functional gate structure is provided by metal gate conductor that is in direct contact with the channel region of the device. Contrary to a MOSFET that includes a gate structure composed of a gate conductor and a gate dielectric, in which the gate dielectric is positioned between the gate conductor and the channel region, the gate structure of the Schottky gate field effect transistor does not include a gate dielectric. The metal gate conductor of the functioning gate structure of a Schottky gate field effect transistor produces Schottky barriers that exist along the interface between the metal gate conductor and the semiconductor substrate. A "Schottky barrier" is a potential barrier formed at a metal—semiconductor junction which has rectifying characteristics.

The method for forming the Schottky gate field effect transistor 200 is similar to the JFET device that is described above with reference to FIGS. 1-5 with the exception that instead of a functioning gate conductor 30 composed of a doped semiconductor material, as used in the JFET device, the functioning gate conductor 40 of the Schottky gate field effect transistor 200 is composed of an elemental metal. Therefore, the above description of the replacement gate process for forming a JFET that is depicted in FIGS. 1-5 is suitable for forming the Schottky gate field effect transistor 200 depicted in FIG. 6, with the exception of the forming of the functioning gate conductor in the opening provided by removing the replacement gate structure.

The functioning gate conductor 40 of the Schottky gate field effect transistor 200 is formed by depositing a metal within the opening formed by removing the replacement gate structure. The metal deposited within the opening has a composition that is suitable for forming a Schottky barrier with the channel region 1 of the SOI substrate 5. The composition of the metal is selected to provide a suitable work function for the band gap of the channel region 1 to provide the rectifying properties of a Schottky barrier. In determining suitable materials for the metal that provides the functioning gate conductor 40 of the Schottky gate field effect transistor 200, the dopant conductivity, e.g., n-type or p-type conductivity, of the channel region 1 is also considered. Examples of metals suitable for the metal of the functioning gate conductor 40 include aluminum, tungsten, copper, nickel, silver, gold, titanium, cobalt, scandium, erbium, yttrium, manganese, zirconium, vanadium, chromium, tantalum, molybdenum, platinum and combinations thereof.

The metal may be deposited within the opening by a PVD method, such as sputtering. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the metal-containing layer 25 include DC diode type systems, radio frequency (RF) sputtering, magnetron sputtering, and ionized metal plasma (IMP) sputtering. In another example, the metal may be deposited using CVD. Variations of CVD processes include but are not limited to APCVD, LPCVD, PECVD, MOCVD and combinations thereof.

In the above embodiments depicted in FIGS. 1-6, an SOI substrate 5 having an SOI layer 20 with a thickness of less than 10 nm provides the substrate for the JFET 100 and Schottky gate field effect transistors 200. The present disclosure is also applicable to forming JFET and Schottky gate field effect transistors on bulk semiconductor substrate 5b, and forming JFET and Schottky gate field effect transistors on semiconductor on insulator (SOI) substrates 5a with a semiconductor on insulator (SOI) layer 20a that has a thickness greater than 10 nm, as depicted in FIGS. 7-9.

Figure 7:
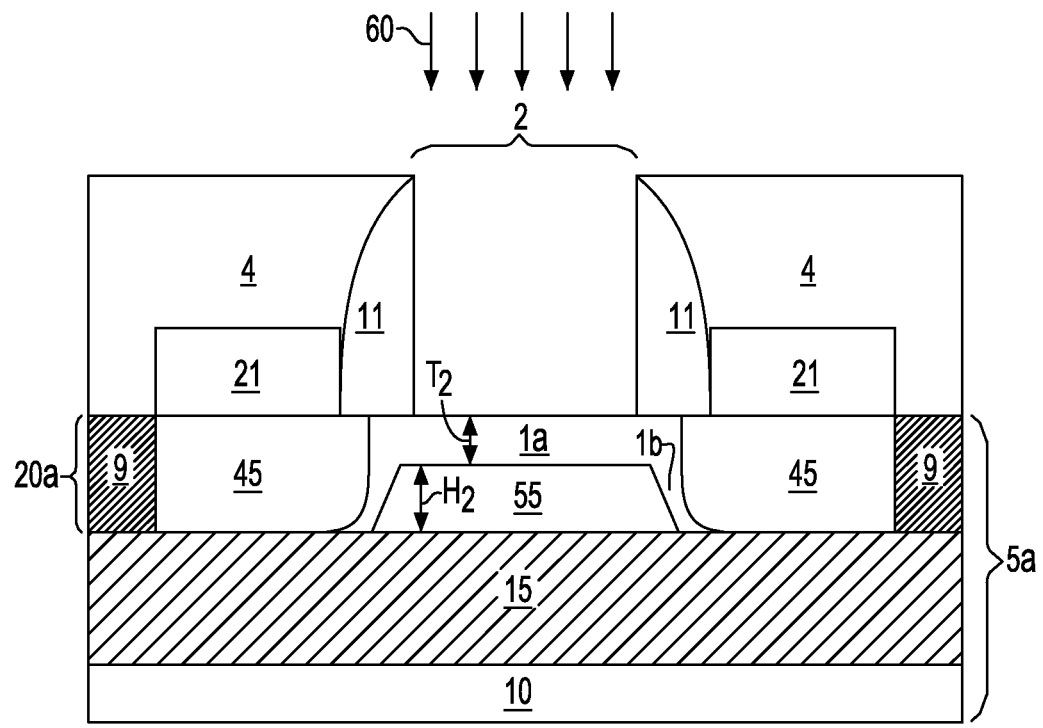
FIGS. 7 and 8 depict one embodiment of a method of fabricating a JFET on a semiconductor on insulator (SOI) substrate, in which a functional gate conductor having a uniform dopant concentration is epitaxially formed in direct contact with the semiconductor on insulator (SOI) layer of the SOI substrate, in which a well dopant region is present in the channel region of the JFET, in accordance with the present disclosure.
Figure 8:
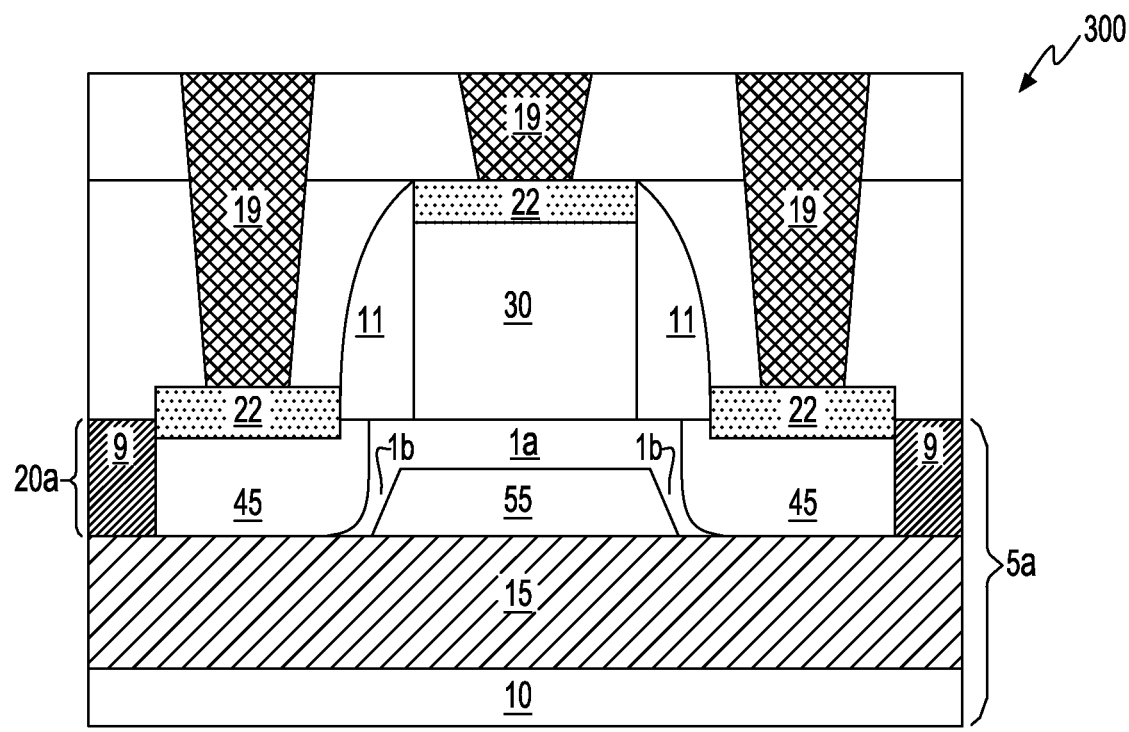
Figure 9:
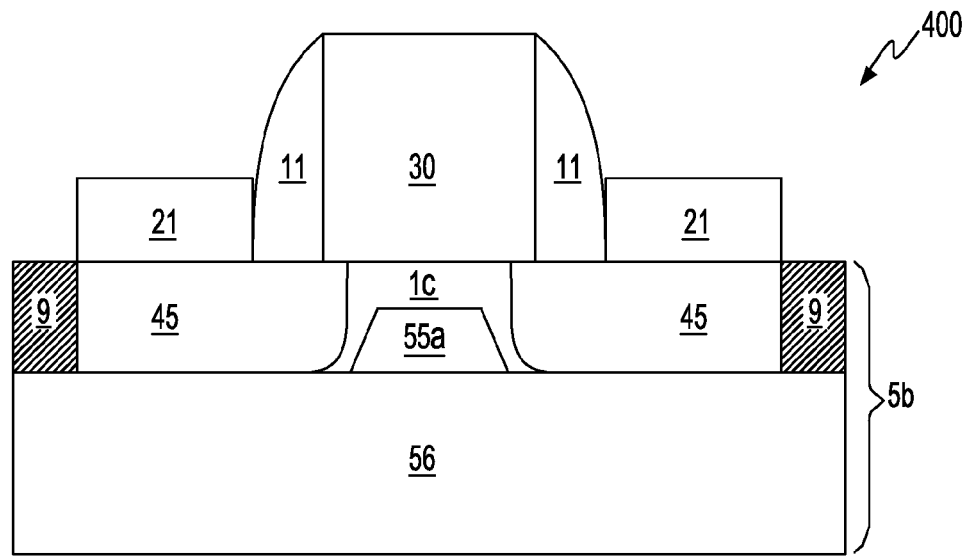
FIG. 9 depicts one embodiment of a JFET on a bulk semiconductor substrate, in which a functional gate conductor having a uniform dopant concentration is epitaxially formed in direct contact with the channel region of the substrate that includes a well dopant region, in accordance with the present disclosure.

FIGS. 7 and 8 depict one embodiment, in which a semiconductor device 300, such as a JFET or a Schottky gate field effect transistor is formed on an SOI substrate 5a that includes an SOI layer 20a that has a thickness greater than 10 nm. The SOI substrate 5a that is depicted in FIG. 7 is similar to the SOI substrate 5 that is depicted in FIG. 1 with the exception that the SOI layer 20a that is depicted in FIG. 7 has a greater thickness than the SOI layer 20 that is depicted in FIG. 1. Therefore, the above description of the SOI substrate 5 that is depicted in FIGS. 1-5 is suitable for forming the SOI substrate 5a depicted in FIG. 7.

The method for forming the semiconductor devices 300, e.g., JFET or Schottky gate field effect transistor, that are depicted in FIGS. 7 and 8 are similar to the methods for forming the semiconductor devices, e.g., JFET 100 or Schottky gate field effect transistor 200, that are depicted in FIGS. 1-6, which the exception that the method for forming the JFET or the Schottky gate field effect transistor that is depicted in FIGS. 7-8 includes a step of forming a well region 55 in the channel region 1a, 1b of the SOI layer 20a. The well region 55 is doped to a conductivity type that is opposite the conductivity type of the channel region 1a, 1b. For example, if the channel region 1a is of an n-type conductivity, the well region 55 is of a p-type conductivity. The well region 55 is positioned centrally within the channel region 1a, 1b and is in direct contact with the dielectric layer 15 of the SOI substrate 5a. The height H2 of the well region 55 is selected so that the remaining portion of the channel region 1a having the opposite dopant conductivity as the well region 55 has a thickness T2 of 10 nm or less, as measured from the upper surface of the SOI layer 20a.

The remaining portion of the channel region 1a, i.e., upper portion of the channel region, having the opposite conductivity type as the well region 55 is defined by the portion of the channel region 1a in which the majority dopant concentration is provided by dopant having the opposite conductivity as the dopant of the well region 55. For example, a tail of dopant for the well region 55 may be present in the portion of the channel region 1a that is overlying the well region 55, but the dopant concentration for the tail of dopant is present at a lesser concentration than the dopant present in the channel region 1a having the opposite conductivity type than the well region 55. In one embodiment, the well region 55 is separated from the extension regions 45 of the source and drain regions by a portion of the channel region 1b having an opposite conductivity type as the well region 55.

The method for forming the semiconductor devices 300, e.g., JFET and Schottky gate field effect transistor, that are depicted in FIGS. 7 and 8, are similar to the methods for forming the JFET 100 and Schottky gate field effect transistor 200 that are described above with reference to FIGS. 1-6 with the exception that the method of forming the semiconductor devices 300, e.g., JFET and Schottky gate field effect transistor, that are depicted in FIGS. 7 and 8 further include the step of forming a well region 55 in the channel region 1a, 1b of the SOI layer 20a. FIG. 7 depicts one embodiment, of forming the well region 55 in the SOI layer 20a using ion implantation to implant the channel region through the opening 2 that is provided by removing the replacement gate structure 2.

After forming the well region 55, the functional gate structure is formed filling the opening. Although FIG. 8 depicts forming a JFET having a doped semiconductor gate conductor 30 that is in direct contact with the SOI layer 20a of the SOI substrate 5a, the functional gate structure may also include a metal gate conductor that is in direct contact with the SOI layer 20a of a Schottky gate field effect transistor. The details for forming the functional gate conductor 30 of the JFET are described above with reference to FIG. 5. The details for forming the functional gate conductor 40 of the Schottky gate field effect transistors are described above with reference to FIG. 6.

FIG. 9 depicts another embodiment of the present disclosure. In the embodiment that is depicted in FIG. 9, a semiconductor device 400, e.g., junction field effect transistor (JFET), is formed on a bulk semiconductor substrate 5b. The semiconductor device 400, e.g., JFET, includes a functional gate conductor 30 having a uniform dopant concentration that is epitaxially formed in direct contact with the channel region 1c of the bulk semiconductor substrate 5c. The channel region 1c includes a well dopant region 55a. The structure and methods to form the structure that is depicted in FIG. 9 is similar to the structure and methods that are described above with reference to FIGS. 1-8 with the exception that the semiconductor device 400, e.g., JFET, that is depicted in FIG. 9 includes a bulk semiconductor substrate 5c.

The bulk semiconductor substrate 5c may be any silicon-containing substrate including, but not limited to, Si, single crystal Si, polycrystalline Si, SiGe, amorphous Si, and compound semiconductor materials, such as type III-V semiconductors. The well dopant region 55a that is present in the channel region 1c is similar to the well dopant region 55 that is depicted in FIGS. 7 and 8 with the exception that the well dopant region 55a that is depicted in FIG. 9 is in contact with a substrate well region 56. The substrate well region 56 is a doped region in the bulk semiconductor substrate 5b, which is typically doped to a conductivity type that is the same as the well dopant region 55a in the channel region 1c. For example, when the well dopant region 55a is doped with a p-type dopant, the substrate well region 56 is typically also doped with a p-type dopant.

The channel region 1c and the extension regions 45 of the source and drain regions typically are doped to a conductivity that is opposite the conductivity of the well dopant region 55a and the substrate well region 56. Although FIG. 9 depicts a JFET device, in which the functional gate structure is provided by an epitaxially formed functional gate conductor 30 of a doped semiconductor material that is in direct contact with the channel region 1c of the bulk semiconductor substrate 5b, a Schottky gate field effect transistor may also be formed on the bulk semiconductor substrate 5b. When forming a Schottky gate field effect transistor, the epitaxially formed functional gate conductor 30 is substituted with a functional gate conductor composed of an elemental metal, which is in direct contact and forms a Schottky barrier with the channel region 1c of the bulk semiconductor substrate 5b.

FIGS. 10-13 depict one embodiment of forming a JFET 500 in combination with a MOSFET 600 on a single SOI substrate 5c. In one embodiment, JFET 500 devices are employed for low-noise applications. FIGS. 10-13 depict one embodiment that allows for co-integration of JFETs 500 with MOSFETs 600. In particular, it is important to have a low-noise device in a high-k CMOS ICs that inherently has higher 1/f noise than conventional SiO2 MOSFETs. The gate structure of the MOSFET 600 typically includes at least one gate dielectric layer 71 between the channel region 1e of the semiconductor substrate 5c and the gate conductor 72.

Figure 10:
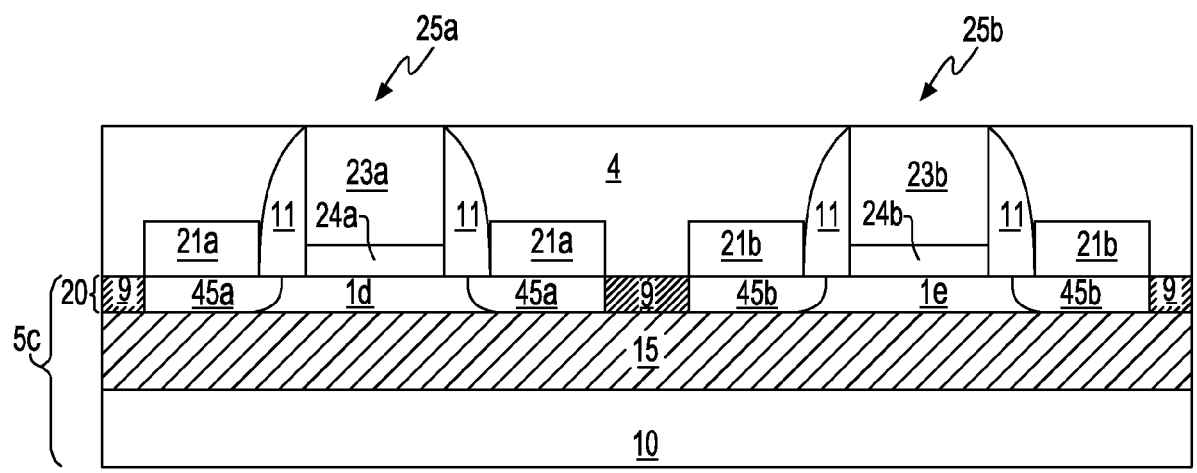
FIG. 10 is a side cross-sectional view of structure including a first and a second replacement gate structure on a semiconductor substrate, forming source and drain regions, and forming a dielectric having an upper surface that is coplanar with an upper surface of the first and second replacement gate structure, as used in one embodiment of a method of forming a JFET and a metal oxide semiconductor field effect transistor (MOSFET) on the same semiconductor substrate, in accordance with the present disclosure.

FIG. 10 depicts one embodiment of a first replacement gate structure 25a and a second replacement gate structure 25b on a semiconductor substrate 5c. Although the semiconductor substrate 5c that is depicted in FIG. 10 is an SOI substrate, the semiconductor substrate 5c may also be a bulk semiconductor substrate. The SOI layer 20, the dielectric layer 15 and the base semiconductor layer 10 that are depicted in FIG. 10 have been described above with reference to FIG. 1. The SOI layer 20 may be an ETSOI layer having a thickness of less than 10 nm, or the SOI layer 20 may have a thickness that is greater than 10 nm. The first replacement gate structure 25a is present in the portion of the semiconductor substrate 5c that is processed to provide the JFET, and the second replacement gate structure 25b is present in the portion of the semiconductor substrate 5c that is processed to provide the MOSFET. The first and second replacement gate structures 25a, 25b are similar to the replacement gate structure 25 that is described above with reference to FIG. 2, in which each of the first and second replacement gate structures 25a, 25b may each include a sacrificial dielectric layer 24a, 24b, and a sacrificial semiconductor material 23a, 23b. Each of the first and second replacement gate structures 25a, 25b may have a first spacer 11 adjacent thereto. The first portion of the semiconductor substrate 5c that contains the first replacement gate structure 25a is separated from the second portion of the semiconductor substrate 5c that contains the second replacement gate structure 25b by an isolation region 9.

Still referring to FIG. 10, the source and drain regions of the JFET and MOSFET devices may then be formed on opposing sides of the replacement gate structures 25a, 25b. Each source and drain region may include an extension region 45a, 45b and an in-situ doped semiconductor material 21a, 21b, i.e., raised source and drain regions. In one embodiment, the extension regions 45a, 45b of the source and drain regions to the JFET and MOSFET devices have an n-type conductivity, and the channel region 1d, 1e of the JFET and MOSFET devices have an n-type conductivity, in which the concentration of the dopant in the extension regions 45a, 45b is greater than the concentration of the dopant in the channel region 1d, 1e of the JFET and MOSFET devices. Additionally, the conductivity of the source and drain regions corresponding to the JFET may be different from the conductivity of the source and drain regions corresponding to the MOSFET. Selective processing for providing JFET and MOSFET devices having source and drain regions with different conductivity dopant may be provided by using a block mask. The block masks that are used to allow for independent processing of the portion of the semiconductor substrate 5c in which the JFET is formed, and the portion of the semiconductor substrate 5c in which the MOSFET is formed, may be composed of soft and/or hardmask materials and can be formed using deposition, photolithography and etching.

FIG. 10 further depicts forming a dielectric 4 having an upper surface that is coplanar with an upper surface of the first and second replacement gate structures 25a, 25b. The dielectric 4 that is depicted in FIG. 10 is similar to the dielectric that is described above with reference to FIG. 3.

Figure 11:
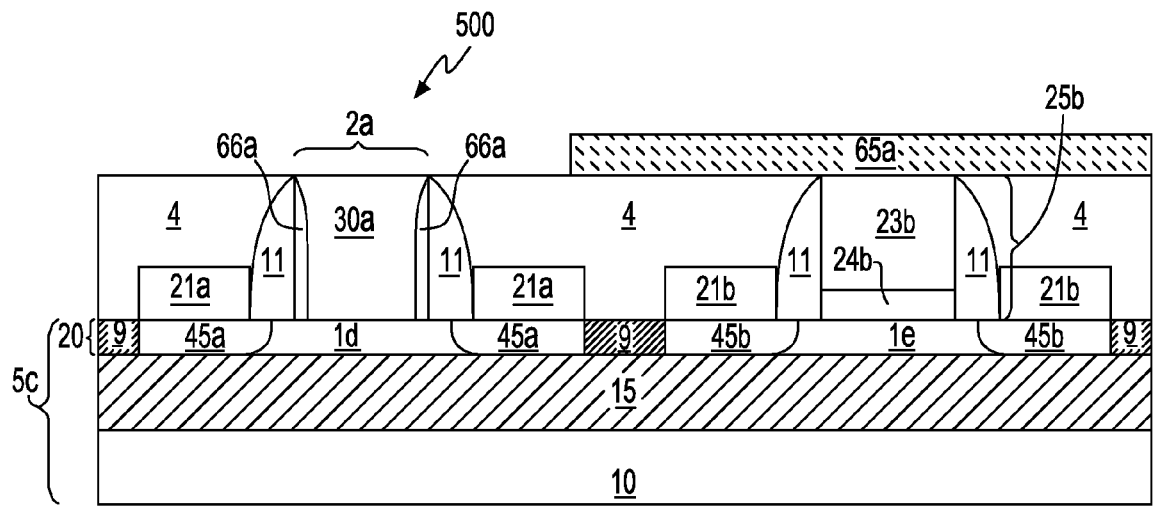
FIG. 11 is a side cross-sectional view of removing the first replacement gate structure to provide a first opening to a first portion of the semiconductor substrate, and epitaxially growing a functional gate conductor within the first opening to provide a JFET, in accordance with one embodiment of the present disclosure.

FIG. 11 depicts removing the first replacement gate structure 25a to provide a first opening 2a to an exposed portion of a first portion of the semiconductor substrate 5c, and epitaxially growing a functional gate conductor 30a within the first opening 2a in direct contact with the semiconductor substrate 5c to provide a JFET device 500 in the first portion of the semiconductor substrate 5c.

The first replacement gate structure 25a may be removed using a selective etch process. In one embodiment, the second replacement gate structure 25b is protected from being removed by the etch process that removes the first replacement gate structure 25a with a first block mask 65a that is formed overlying the second portion of the semiconductor substrate 5c in which the MOSFET devices are subsequently formed, which also includes the second replacement gate structure 25b. The first block mask 65a may be a hard mask. Although oxide, e.g., $SiO_2$, hard masks are typically employed, the present disclosure also contemplates utilizing nitride and oxynitride hard masks. The thickness of the hard mask can vary depending on the type of material used, as well as the deposition process that is employed in forming the same. Typically, the hard mask has an as deposited thickness ranging from 5 nm to 40 nm, with an as deposited thickness ranging from 10 nm to 25 nm being even more typical.

In one embodiment, a hard mask, i.e., first block mask 65a, is positioned overlying at least the second replacement gate structure 25b leaving the first replacement gate structure 25a exposed using deposition, photolithography and etching. In one embodiment, a material layer for the hard mask may be blanket deposited overlying the entire semiconductor substrate 5c. The material layer for the hard mask may be deposited using a deposition process, such as CVD, PECVD, chemical solution deposition and evaporation.

Following deposition of the material layer for the hard mask, the material layer may be patterned and etched to expose the first replacement gate structure 25a, wherein a remaining portion of the material layer is present overlying and protecting the second replacement gate structure 25b. More specifically, and in one embodiment, a layer of photoresist is deposited atop the entire material layer for the hard mask. The photoresist layer is then selectively exposed to light and developed to pattern a photoresist block mask, protecting at least the portion of the material layer for the hard mask that is present over the second replacement gate structure 25b. The exposed portion of material layer for the hard mask may be removed with an etch that is selective to at least the photoresist block mask. The portion of the material layer for the hard mask that remains provides the first block mask 65a. The photoresist block mask may then be removed.

In one embodiment, following the formation of the first block mask 65a, the first replacement gate structure 25a may be removed using an etch process that is selective to the first block mask 65a. More specifically, and in one example, the etch process that removes the first replacement gate structure 25a is typically selective to the first block mask 65a, the SOI layer 20 of the semiconductor substrate 5c and the dielectric 4. The etch process for removing the first replacement gate structure 25a is similar to the etch process that removes the replacement gate structure 25 that is described above with reference to FIG. 3. Therefore, the above description of the removing the replacement gate structure 25 that is depicted in FIG. 3 is suitable for forming removing the replacement gate structure 25a that is depicted in FIG. 11.

FIG. 11 also depicts forming a second spacer 66a on the sidewalls of the first opening 2a in the first portion of the semiconductor substrate 5c in which the JFET 500 is formed. The second spacer 66a may be formed by depositing a conformal dielectric layer on at least the base and sidewall surfaces of the first opening 2a. By conformal it is meant that the thickness of the layer at the base of the first opening 2a is substantially the same as the thickness of the layer on the sidewalls of the first opening 2a. In one embodiment, the conformal dielectric layer has a thickness that does not deviate from greater than or less than 20% of an average value for the thickness of the layer. The conformal dielectric layer is typically deposited using CVD, such as PECVD. The portion of the conformal dielectric layer that is present at the base of the first opening 2a is then removed using an anisotropic etch process. The anisotropic etch may include RIB. Other examples of anisotropic etching that can be used include ion beam etching, plasma etching or laser ablation. Due to the anisotropic nature of the etch, the portion of the conformal dielectric layer that is present at the base of the first opening 2a is removed, and a portion of the conformal dielectric layer remains on the sidewalls of the first opening 2a to provide the second spacer 66a. The width of the second spacer 66a is selected to provide non-conformal epitaxial growth of the functional gate conductor 30a on the exposed portion of the SOI layer 20 that is exposed by the first opening 2a.

In some embodiments, following the formation of the second spacer 66a, the functional gate conductor 30a of the JFET 500 is formed on the channel region 1d of the SOI layer 20 of the SOI substrate 5c. The functional gate conductor 30a is composed of an epitaxially grown material. Typically, the epitaxially grown material that provides the functional gate conductor 30a can only deposit on a semiconductor surface, such as the channel region 1d of the SOI layer 20 that is exposed by the first opening 2a. Therefore, the epitaxially grown material is not formed on the upper surface of the dielectric layer 4, and is obstructed from being formed on the upper surface of the second replacement gate structure 25b by the first block mask 65a. The epitaxial growth process for forming the functional gate conductor 30a that is depicted in FIG. 11 is similar to the functional gate conductor 30 that is described above with reference to FIG. 4. Therefore, the above description of the functional gate conductor 30 that is depicted in FIG. 4 is suitable for forming the functional gate conductor 30a that is depicted in FIG. 11. In one embodiment, the first block mask 65a may be removed following the formation of the functional gate conductor 30a.

Although FIGS. 10-13 depict forming a JFET 500 on the same semiconductor substrate 5c that a MOSFET 600 is present on, the present disclosure is not limited to this sole embodiment. For example, the JFET 500 may be substituted with a Schottky gate field effect transistor. To form a Schottky gate field effect transistor, the functional gate conductor 30a that is depicted in FIG. 11 is substituted with a functional gate conductor composed of an elemental metal, which is in direct contact and forms a Schottky barrier with the channel region 1d of the SOI layer 20 of the semiconductor substrate 5c. The details for forming a functional gate conductor composed of an elemental metal suitable for a Schottky gate field effect transistor are disclosed above with reference to FIG. 6.

Figure 12:
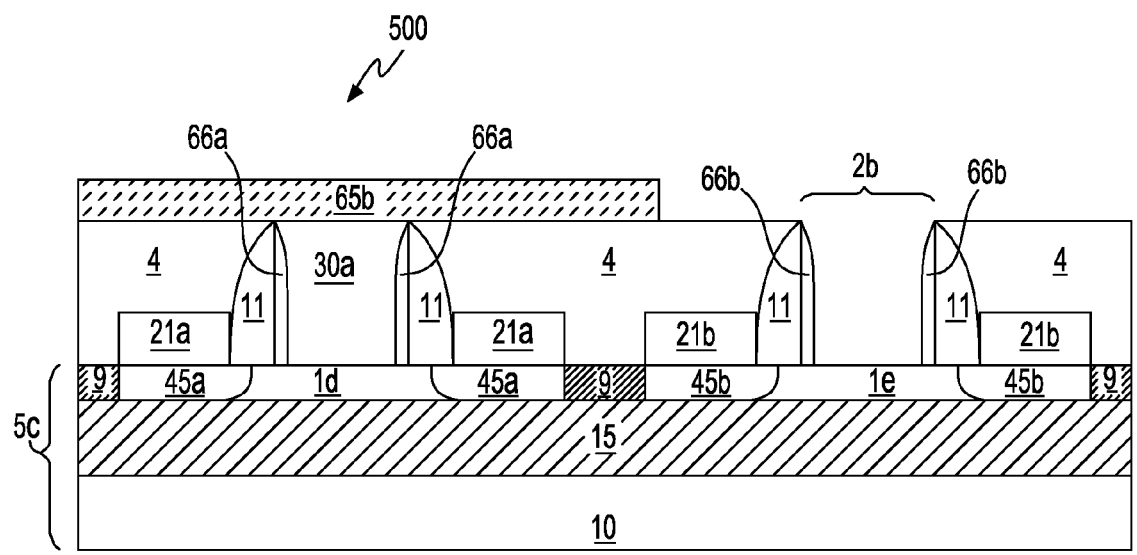
FIG. 12 is a side cross-sectional view depicting one embodiment of removing the second replacement gate structure to provide a second opening to the semiconductor substrate, in accordance with the present disclosure.

FIG. 12 depicts one embodiment of removing the second replacement gate structure 25b to provide a second opening 2b to an exposed portion of the second portion of the semiconductor substrate 5c in which the MOSFET is formed. In one embodiment, before removing the second replacement gate structure 25b, a second block mask 65b is formed overlying and protecting the functional gate conductor 30a of the JFET device 500. The second block mask 65b is similar in composition and method of formation as the first block mask 65a with the exception that the second block mask 65b is formed over the functional gate conductor 30a instead of the first replacement gate structure.

Following formation of the second block mask 65b, the second replacement gate structure 25b may be removed using an etch process that is selective to the second block mask 65b. More specifically, in one example, the etch process that removes the second replacement gate structure 25b is typically selective to the second block mask 65b, the SOI layer 20 of the semiconductor substrate 5c, and the dielectric 4. The above description of the removing the replacement gate structure 25 that is depicted in FIG. 3 is suitable for forming removing the second replacement gate structure 25b that is depicted in FIG. 12. Removing the second replacement gate structure 25b provides a second opening 2b that exposes the portion of the SOI layer 20 that provides the channel region 1e for the MOSFET. Similar to the second spacers 66a that are formed within the first opening 2a, second spacers 66b may also be formed on the sidewalls of the second opening 2b. The above description for forming the second spacers 66a depicted in FIG. 11 is suitable for forming the second spacers 66b depicted in FIG. 12.

Figure 13:
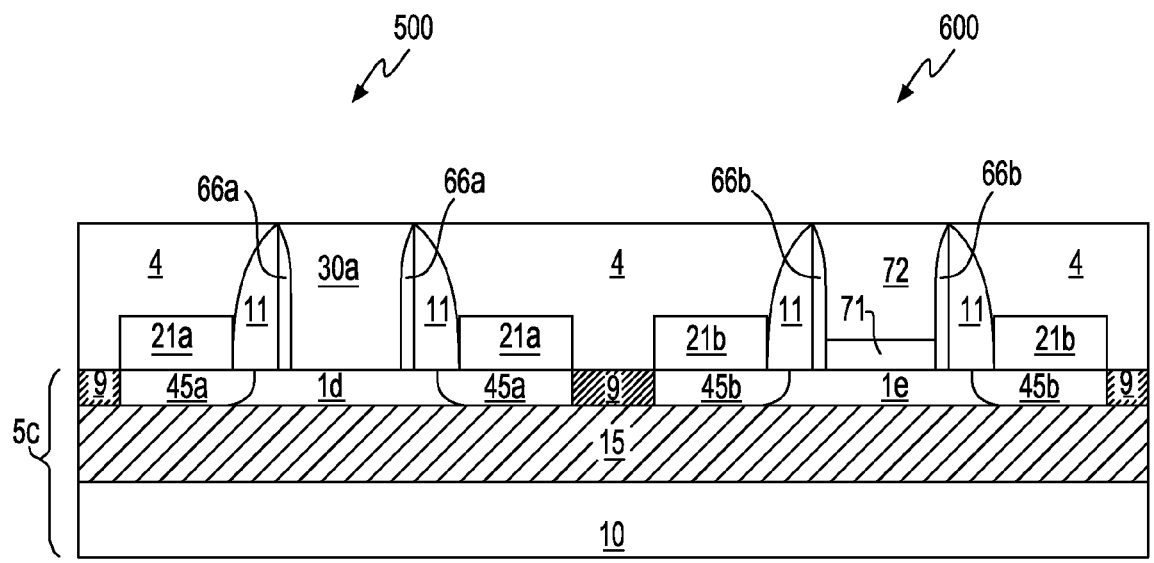
FIG. 13 is a side cross-sectional view depicting one embodiment of forming a functional gate structure within the second opening including a gate dielectric in direct contact with the semiconductor substrate to provide a MOSFET, in accordance with the present disclosure.

FIG. 13 depicts one embodiment of forming a functional gate structure 70 to a MOSFET device 600. The functional gate structure 70 includes at least one gate dielectric 71 in direct contact with the channel region 1e of the MOSFET 600, and at least one gate conductor 72 in direct contact with at least one gate dielectric 71. The functional gate structure 70 to the MOSFET 600 is formed within the second opening 2b. The material layers that provide the at least one gate dielectric 71 and the at least one gate conductor 72 may be formed within the second opening 2b using deposition or growth processes, such as thermal growth, CVD, PVD and combinations thereof. Examples of growth processes include thermal oxidation and nitridation. Examples of CVD include APCVD, LPCVD, PECVD, MOCVD and combinations thereof. Examples of PVD include plating and sputter. The material layers that provide the at least one gate dielectric 71 and the at least one gate conductor 72 may also be deposited using evaporation, chemical solution deposition, and spin on deposition.

The at least one gate dielectric 71 may be comprised of an insulating material having a dielectric constant of 4.0 or greater. In another embodiment, the at least one gate dielectric 71 is comprised of an insulating material having a dielectric constant greater than 7.0. The dielectric constants mentioned herein are relative to a vacuum at room temperature. In one embodiment, the at least one gate dielectric 71 employed in the present disclosure includes, but is not limited to, an oxide, nitride, oxynitride and/or silicates including metal silicates, aluminates, titanates and nitrides. In one example, when the at least one gate dielectric 71 is comprised of an oxide, the oxide may be selected from the group including, but not limited to $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of each layer of the at least one gate dielectric 71 may vary, but typically, has a thickness ranging from 1 nm to 10 nm. In one example, the at least one gate dielectric 71 is a single layer having a thickness ranging from 1 nm to 3 nm.

The at least one gate conductor 72 may be composed of a metal or a doped semiconductor material. The at least one gate conductor 72 may be any conductive metal including, but not limited, to W, Ni, Ti, Mo, Ta, Cu, Pt, Ag, Au, Ru, Ir, Rh, and Re, and alloys that include at least one of the aforementioned conductive elemental metals. In one example, the at least one gate conductor 72 may be a doped semiconductor material, such as a doped silicon containing material, e.g., doped polysilicon.

Following deposition of the material layers to provide the functional gate structure 70 to the MOSFET 600, the structure may be planarized so that the upper surfaces of the dielectric 4, the functional gate conductor 30a, and the at least one gate conductor 72 are coplanar. The planarization process may be CMP.

In each of the embodiments depicted in FIGS. 1-13, the JFET, Schottky gate field effect transistors, and MOSFETs are planar semiconductor devices. In a planar semiconductor device, the functional gate structure of the device is typically formed on the upper surface of the semiconductor substrate, in which the channel region of the device in present in the portion of the semiconductor substrate that is underlying the functional gate structure. The present disclosure is also applicable to semiconductor devices that include fin structures, such as fin field effect transistors (finFETS). Typically, in a finFET the functional gate structure is in direct contact with at least the sidewall, and in some examples the upper surface, of a fin structure that provides the channel region of the semiconductor device. The fin structure may be formed on the upper surface of the semiconductor substrate, or may be formed from the SOI layer of SOI substrate.

FIGS. 14-20 depict one embodiment of a method of fabricating a finFET 700. The method depicted in FIGS. 14-20 may have an initial process sequence that forms a replacement gate structure 603 on a portion of a fin structure 601, in which source regions and drain regions 602 are present on and/or in the fin structure 601 on opposing sides of the replacement gate structure 603. A dielectric 604 is formed on a portion of a substrate 600 having an upper surface that is coplanar with an upper surface of the replacement gate structure 603. Following forming the dielectric 604, the replacement gate structure 603 is removed to provide an opening 605 to an exposed portion of the fin structure 601. A functional gate conductor 606 is epitaxially grown within the opening 605 in direct contact with the first portion of the fin structure 601. The method and structures depicted in FIGS. 14-20 are now discussed in greater detail. Although FIGS. 14-20 depict forming two finFETs 700 on a single substrate 600, the present disclosure is not limited to only this example, as any number of finFETs 700 may be included on the substrate 600.

Figure 14:
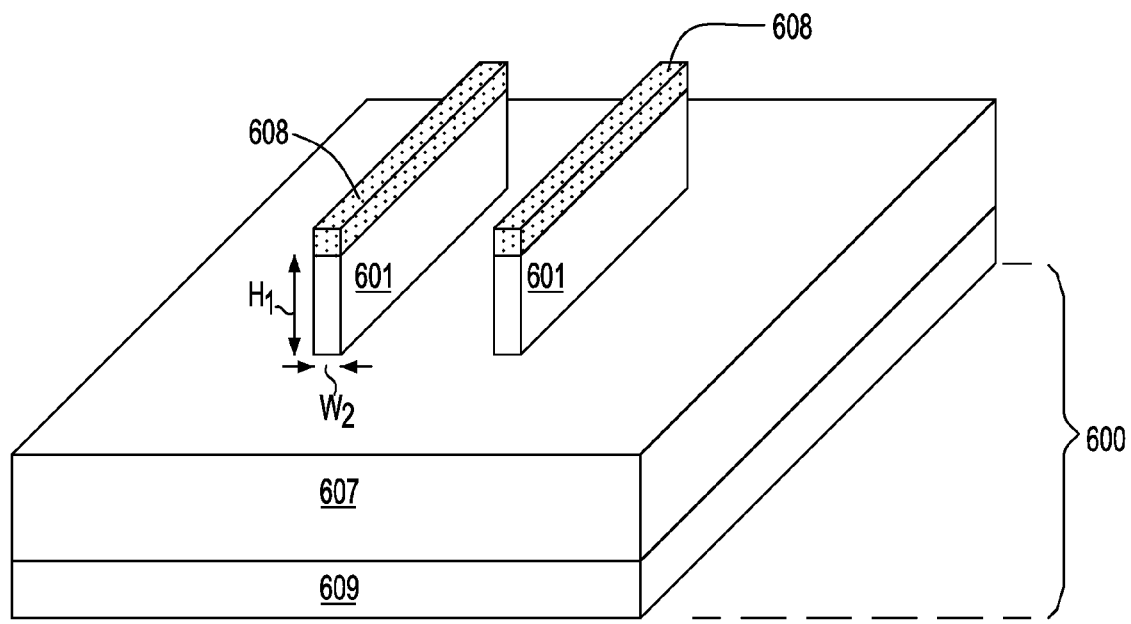
FIG. 14 is a perspective view that depicts one embodiment of a fin structure that is suitable for forming a fin field effect transistor (finFET), in accordance with the present disclosure.

FIG. 14 depicts an initial structure used in one embodiment of a method for forming a finFET. The initial structure may include a fin structure 601 present atop a dielectric layer 607. In one embodiment, a dielectric fin cap 608 may be present on the fin structure 601. In one embodiment, the fin structure 601 and the dielectric layer 607 may be provided from the substrate 600. More specifically, in some embodiments, the substrate 600 may be an SOI substrate, in which the top semiconductor layer of the SOI substrate provides the fin structure 601. In this embodiment, the SOI substrate typically includes a bottom semiconductor layer 609 and a top semiconductor layer (hereafter referred to as an SOI layer) that are electrically isolated from each other by a buried insulating layer (hereafter referred to as a dielectric layer 607). The SOI layer and the bottom semiconductor layer 609 may comprise at least one of Si, Ge alloys, SiGe, GaAs, InAs, InP, SiCGe, SiC as well as other III/V or II/VI compound semiconductors. The SOI layer and bottom semiconductor layer 609 may comprise the same or different materials. The substrate 600 is hereafter referred to as an SOI substrate 600.

The dielectric layer 607 separating the SOI layer and the bottom semiconductor layer 609 may be a crystalline or non-crystalline oxide, nitride, oxynitride, or any other insulating material. The 601 substrate 600 employed in the present disclosure may be formed utilizing a layer transfer process including a bonding step. Alternatively, an implantation process such as SIMOX (Separation by IMplantation of OXygen) can be used in forming the SOI substrate 600.

The thickness of the various layers of the SOI substrate 600 may vary depending on the technique used in forming the same. In one embodiment, the SOI layer has a thickness ranging from 3 nm to 100 nm, the dielectric layer 607 (also referred to as buried dielectric layer) has a thickness ranging from 10 nm to 150 nm, and the thickness of the bottom semiconductor layer 609 of the SOI substrate 600 may range from 10 nm to 500 nm. It is noted that although an SOI substrate 600 is depicted and described in the following discussion, embodiments of the present disclosure are contemplated that utilize a bulk semiconductor substrate. In one example of the present disclosure, in which a bulk semiconductor substrate is used, the bulk semiconductor substrate comprises at least one of Si, Ge alloys, SiGe, GaAs, InAs, InP, SiCGe, SiC as well as other III/V or II/VI compound semiconductors.

In one embodiment, prior to etching the SOI substrate 600 to provide the fin structure 601, a layer of the dielectric material that provides the dielectric fin cap 608 is deposited atop the SOI substrate 600. The dielectric fin cap 608 may be composed of a nitride, oxide, oxynitride material, and/or any other suitable dielectric layer. The dielectric fin cap 608 may comprise a single layer of dielectric material or multiple layers of dielectric materials. The dielectric fin cap 608 can be formed by a deposition process, such as CVD and/or ALD.

Alternatively, the dielectric fin cap 608 may also be formed using a growth process, such as thermal oxidation or thermal nitridation. The dielectric fin cap 608 may have a thickness ranging from 1 nm to 100 nm. In one embodiment, the dielectric fin cap 608 is composed of an oxide, such as $SiO_2$, that is formed by chemical vapor deposition to a thickness on the order of 25 nm to 50 nm.

In one embodiment, following the formation of the layer of dielectric material that provides the dielectric fin cap 608, a photolithography and etch process sequence applied to the dielectric fin cap 608 and the SOI substrate 600 may provide the initial structure that is depicted in FIG. 14. Specifically, in one example, a photoresist mask is formed overlying the layer of the dielectric material that provides dielectric fin cap 608 and is present overlying the SOI layer of the SOI substrate 600, in which the portion of the dielectric material that is underlying the photoresist mask provides the dielectric fin cap 608, and the portion of the SOI layer that is underlying the photoresist mask provides the fin structure 601. The exposed portions of the dielectric material that provides dielectric fin cap 608 and the SOI layer, which are not protected by the photoresist mask, are removed using a selective etch process. To provide the photoresist mask, a photoresist layer is first positioned on the layer of the dielectric material that provides dielectric fin cap 608. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 608 followed by removing the unprotected portion of the SOI layer selective to the underlying buried insulating layer, i.e., dielectric layer 607. For example, the transferring of the pattern provided by the photoresist into the underlying structures may include an anisotropic etch. The anisotropic etch may include RIE. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structure 601 can be formed by spacer imaging transfer technique well-known in the art.

The fin structure 601 may have a height $H_1$ ranging from 5 nm to 200 nm. In one embodiment, the fin structure 601 has a height $H_1$ ranging from 10 nm to 100 nm. In another embodiment, the fin structure 601 has a height $H_1$ ranging from 20 nm to 50 nm. In one embodiment, the fin structure 601 has a width $W_2$ of less than 20 nm. In another embodiment, the fin structure 601 has a width $W_2$ ranging from 3 nm to 8 nm.

Figure 15:
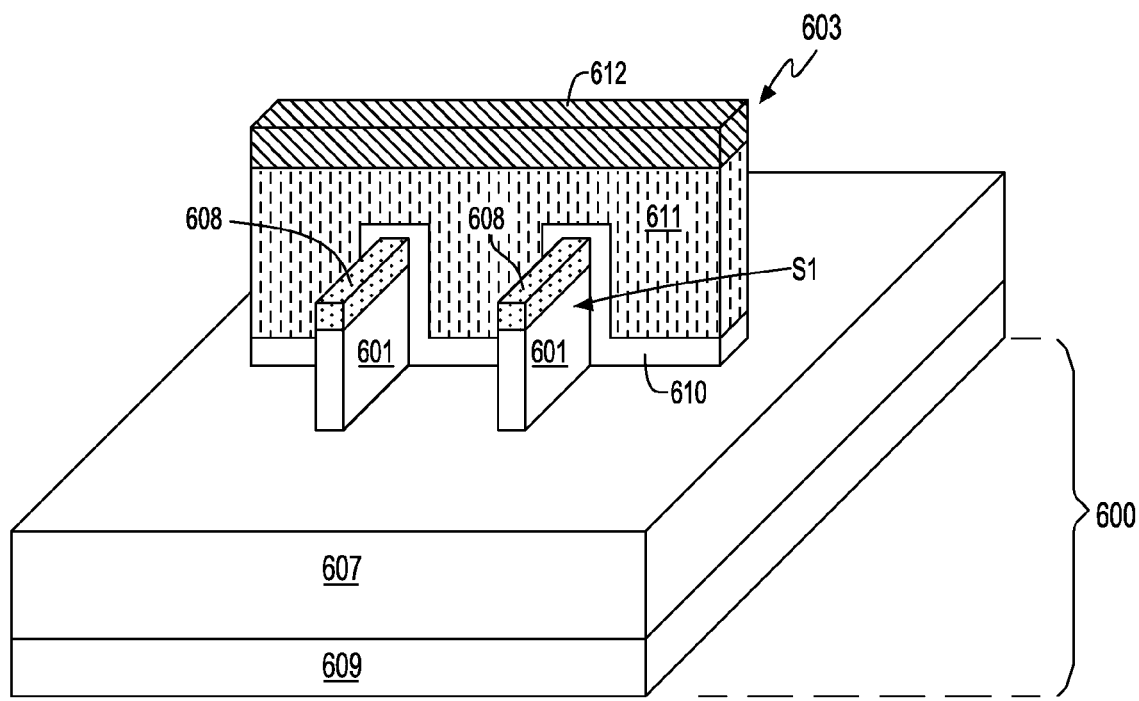
FIG. 15 is a perspective view that depicts one embodiment forming a replacement gate structure atop a first portion of the fin structure, in accordance with the present disclosure.

FIG. 15 depicts forming a replacement gate structure 603 on the fin structure 601 and the dielectric fin cap 608. In one embodiment, the replacement gate structure 603 includes a sacrificial dielectric layer 610 in contact with at least the fin structure 601, a sacrificial semiconductor material 611 on the sacrificial dielectric layer 610, and a sacrificial dielectric cap 612 on the sacrificial semiconductor material 611. The replacement gate structure 603 may be formed by forming blanket material layers for the sacrificial dielectric layer 610, the sacrificial semiconductor material 611 and the sacrificial dielectric cap 612 to provide a gate stack, and patterning and etching the gate stack to provide the replacement gate structure 603. The replacement gate structure 603 can be formed utilizing photolithography and etch process steps. Specifically, a pattern is produced by applying a photoresist to the surface to be etched; exposing the photoresist to a pattern of radiation, and then developing the pattern into the photoresist utilizing conventional resist developer. Once the patterning of the photoresist is completed, the sections covered by the photoresist are protected while the exposed regions are removed using a selective etching process that removes the unprotected regions. In one embodiment, the portion of the gate stack that is removed to provide the replacement gate structure 603 exposes the sidewalls Si of the fin structure 602.

The sacrificial dielectric layer 610 of the replacement gate structure 603 may be composed of any dielectric material, such as an oxide, nitride, or oxynitride material. In one embodiment, the composition of the sacrificial dielectric layer 610 is selected so that the sacrificial dielectric layer 610 is removed by an etch that is selective to the underlying portion of the fin structure 601. The sacrificial dielectric layer 610 is typically positioned on at least a portion of the sidewalls Si of the fin structure 603. The sacrificial dielectric layer 610 may be formed by a thermal growth process such as, for example, oxidation, nitridation or oxynitridation. The sacrificial dielectric layer 610 may also be formed by a deposition process such as, for example, CVD, PECVD, MOCVD, ALD, evaporation, reactive sputtering, chemical solution deposition and other like deposition processes. In one embodiment, the sacrificial dielectric layer 610 is deposited using a conformal deposition process. The sacrificial dielectric layer 610 may also be formed utilizing any combination of the above processes.

After forming the sacrificial dielectric layer 610, the sacrificial semiconductor material 611 of the replacement gate structure 603 is formed on the sacrificial dielectric layer 610 utilizing a deposition process, such as PVD, CVD or evaporation. In one embodiment, the sacrificial semiconductor material 611 of the replacement gate structure 603 is may be composed of a semiconductor-containing material, such as a silicon containing material. Silicon containing materials that are suitable for the sacrificial semiconductor material C11 include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the sacrificial semiconductor material 611 is amorphous silicon. The physical thickness of the sacrificial semiconductor material 611 may range from 1 nm to 10 nm.

In another embodiment, the sacrificial semiconductor material 611 has a thickness ranging from 1 nm to 3 nm.

The sacrificial dielectric cap 612 may be composed of a nitride, oxide, oxynitride material, and/or any other suitable dielectric layer. The sacrificial dielectric cap 612 may comprise a single layer of dielectric material or multiple layers of dielectric materials. The dielectric layer can be formed by a deposition process, CVD and/or ALD. Alternatively, the sacrificial dielectric cap 612 may be formed using a growth process, such as thermal oxidation or thermal nitridation. The sacrificial dielectric cap 612 may have a thickness ranging from 1 nm to 100 nm. In one embodiment, the sacrificial dielectric cap 612 is composed of a nitride, such as SiN, that is formed by chemical vapor deposition to a thickness on the order of 25 nm to 50 nm.

Figure 16:
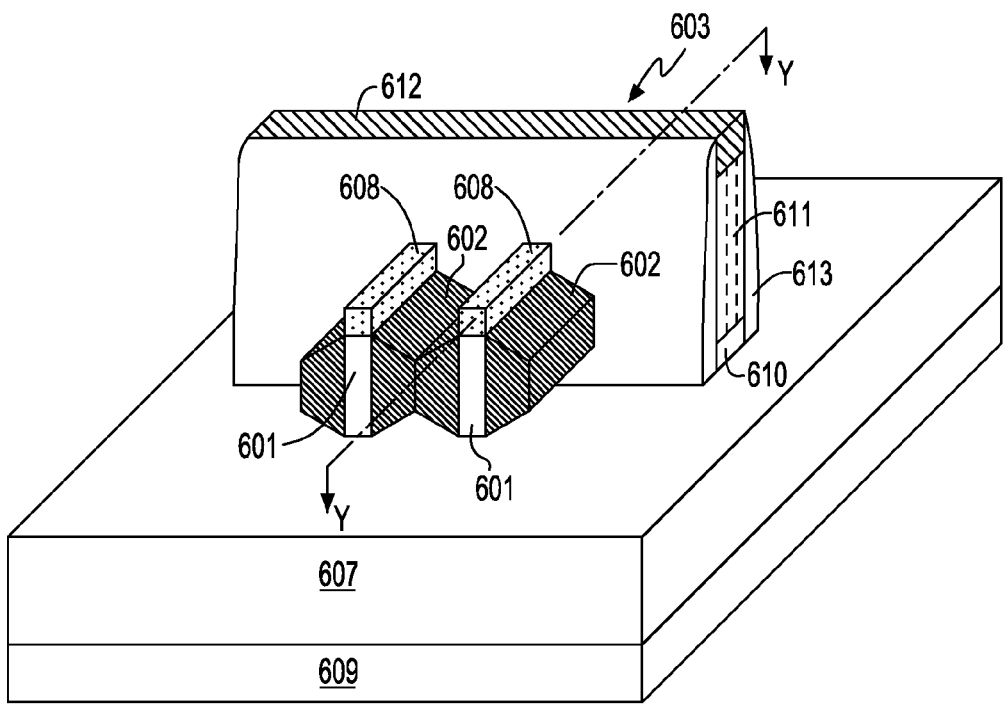
FIG. 16 is a perspective view that depicts one embodiment of forming source and drain regions in the fin structure on opposing sides of the replacement gate structure, in accordance with the present disclosure.

FIG. 16 depicts forming a first spacer 613 in direct contact with the replacement gate structure 603. The first spacer 613 may be formed by depositing a conformal layer of dielectric material, such as oxides, nitrides or oxynitrides. In one embodiment, the etching process is an anisotropic etching process, such as reactive ion etch. The first spacer 613 may have a width ranging from 1 nm to 10 nm, typically ranging from 1 nm to 5 nm.

FIG. 16 further depicts forming in-situ doped semiconductor material on the sidewalls Si of the fin structure 601 to provide at least a portion of the source and drain regions 602. In one embodiment, in-situ doped semiconductor material is formed using an epitaxial growth process. A number of different sources may be used for the deposition of epitaxial silicon. Silicon sources for epitaxial growth include silicon tetrachloride, dichlorosilane ($SiH_2Cl_2$), and silane ($SiH_4$). The composition and method of depositing the in-situ doped semiconductor material that is depicted in FIG. 16 is similar to the in-situ doped semiconductor material that provides the raised source and drain regions of the planar device depicted in FIG. 2.

In one embodiment, in-situ doped semiconductor material is doped with an n-type conductivity dopant during the epitaxial growth process. N-type finFET devices are produced by doping the in-situ doped semiconductor material with elements from group V of the Periodic Table of Elements. In one embodiment, the group V element is phosphorus, antimony or arsenic. P-type finFET devices are produced by doping the in-situ doped semiconductor material with elements from group III of the Periodic Table of Elements. In one embodiment, the group III element is boron, aluminum, gallium or indium.

Still referring to FIG. 16, in one embodiment, dopant from the in-situ doped semiconductor material is diffused into the fin structure 601 to form extension regions for the source and drain regions 602. The portion of the fin structure 601 that is present between the extension regions is the channel region of the finFET device. Typically, the channel region of the finFET has the same conductivity type as the source and drain regions 602. For example, when the extension regions of the source and drain regions 602 are doped to an n-type dopant, the channel region of the fin structure 601 is also doped to an n-type dopant. In another example, when the extension regions of the source and drain regions 602 are doped to a p-type dopant, the channel region of the fin structure 601 is also doped to a p-type dopant. The concentration of the dopant in the extension regions of the source and drain regions 602 is greater than the concentration of the dopant in the channel region of the fin structure 601.

Figure 17:
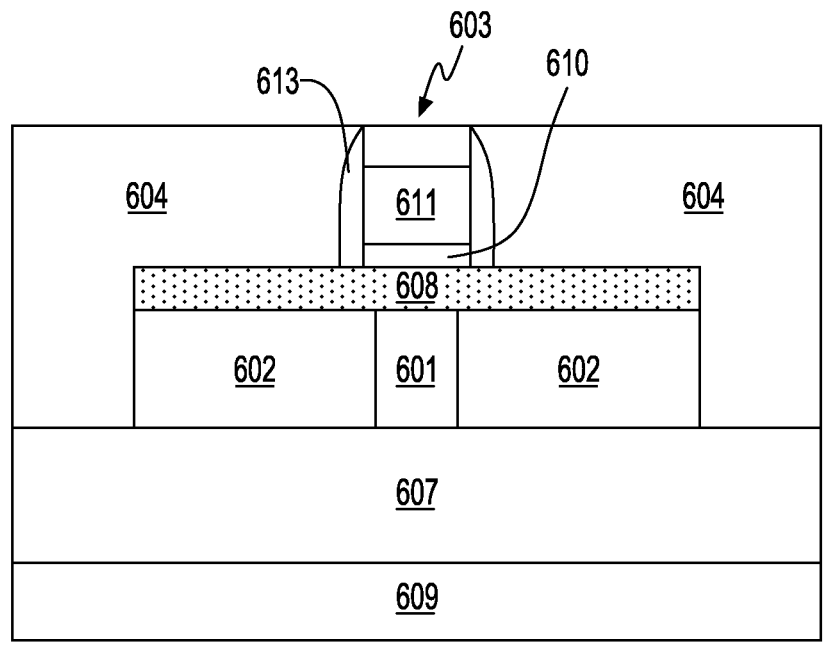
FIG. 17 is a side cross-sectional view along section line Y-Y of FIG. 16 that depicts forming a dielectric having an upper surface that is coplanar with an upper surface of the replacement gate structure, in accordance with the present disclosure.

FIG. 17 depicts one embodiment of forming a dielectric 604 having an upper surface that is coplanar with an upper surface of the replacement gate structure 603. The dielectric 604 that is depicted in FIG. 17 is similar to the dielectric 4 that is described above with reference to FIG. 3. Therefore, the above description of the dielectric depicted in FIG. 3 is suitable for forming the dielectric 604 that is depicted in FIG. 17.

Figure 18:
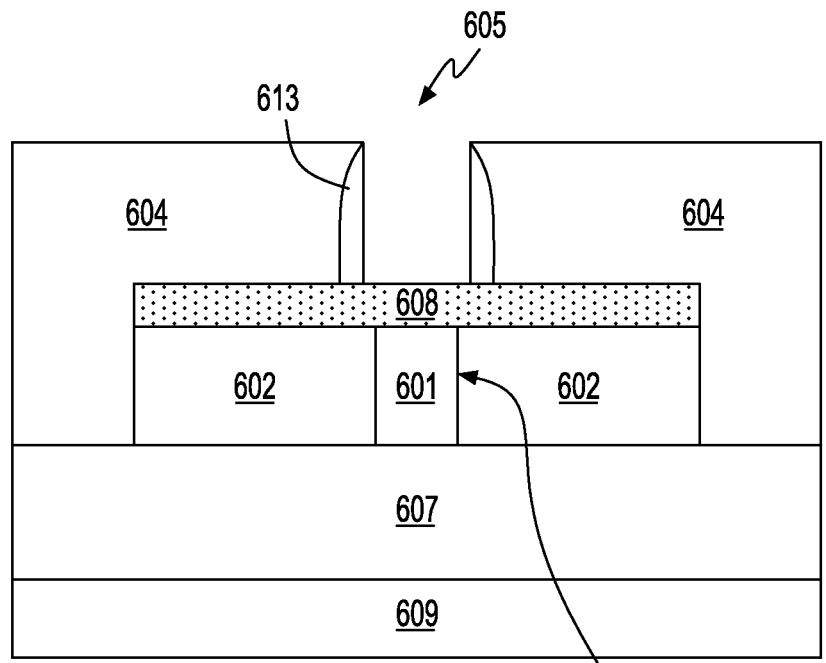
FIG. 18 is a side cross-sectional view depicting removing the replacement gate structure from the structure depicted in FIG. 17 to provide an opening to expose the first portion of the fin structure, in accordance with the present disclosure.

FIG. 18 depicts removing the replacement gate structure 603 from the structure depicted in FIG. 17 to provide an opening 605 to expose the channel region 614 of the fin structure 601. In FIG. 18 the dielectric fin cap 608 is present on the upper surface of the fin structure 601. In the embodiment, depicted in FIG. 18, the sidewall of the fin structure 601 is exposed by removing the replacement gate structure 603. As depicted in FIG. 15, the replacement gate structure 603, e.g., sacrificial dielectric layer 610 of the replacement gate structure 603, is in direct contact with a sidewall portion of the fin structure 601. This sidewall portion of the fin structure 601 is exposed by removing the replacement gate structure 603, in which this sidewall portion of the fin structure 601 provides the channel region 614 of the finFET.

The process for removing the replacement gate structure 603 that is depicted in FIG. 18 is similar to the process for removing the replacement gate structure 25 that is described above with reference to FIG. 3. In both the process for removing the replacement gate structure 603 that is depicted in FIG. 18, and the process for removing the replacement gate structure 25 that is depicted in FIG. 3, the etch chemistry for removing the replacement gate structure 25, 603 is selective to the SOI layer of the SOI substrate 5, 600. One difference between the process for removing the replacement gate structure 603 that is depicted in FIG. 18, and the process for removing the replacement gate structure 25 that is depicted in FIG. 3, is that the replacement gate structure 603 depicted in FIG. 18 further includes a sacrificial dielectric cap 612.

Figure 19:
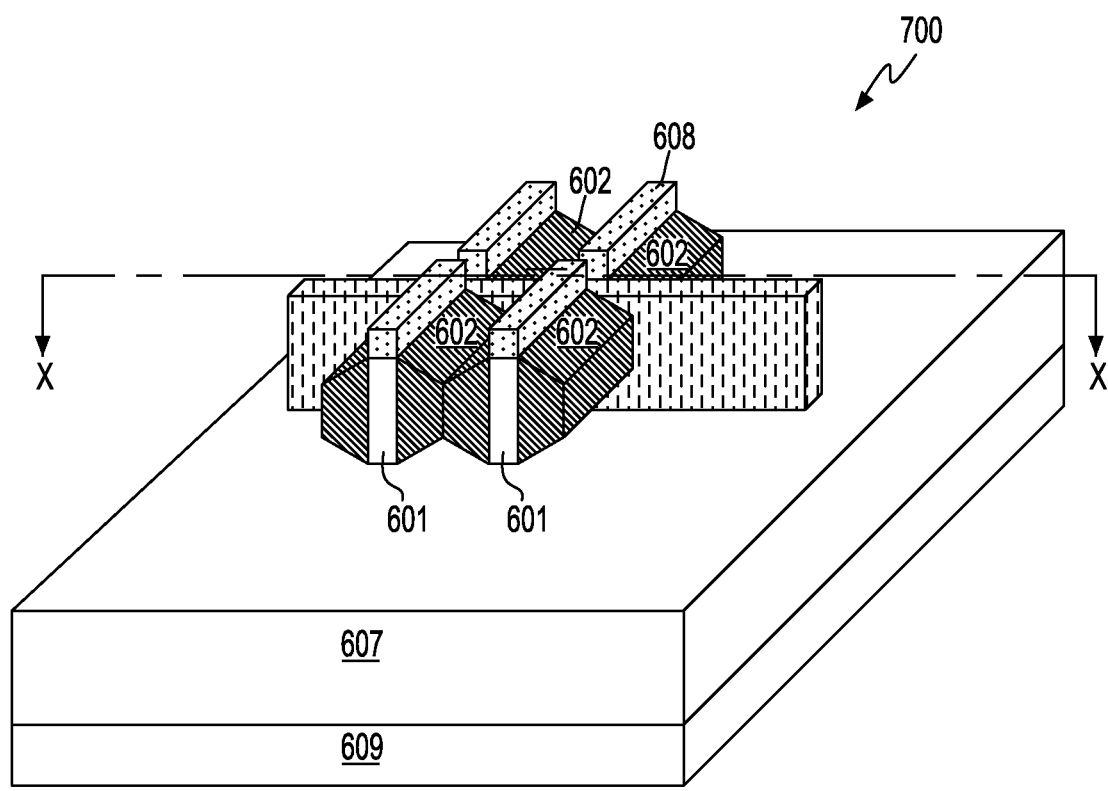
FIG. 19 is a perspective view that depicts one embodiment of epitaxially growing a functional gate conductor in direct contact with the first portion of the fin structure, in accordance with the present disclosure.

FIG. 19 depicts one embodiment of epitaxially growing a functional gate conductor 606 in direct contact with the channel region 614 of the fin structure 601. To more clearly depict the functional gate conductor 606, the dielectric 4 and first spacers 613 have been omitted from FIG. 19. The functional gate conductor 606 is grown on the sidewall of the fin structure 601 that has been exposed by removing the replacement gate structure 603. The functional gate conductor 606 is within the opening 605 that is depicted in FIG. 18, which is provided by removing the replacement gate structure and is defined by the sidewalls of the dielectric 604.

Figure 20:
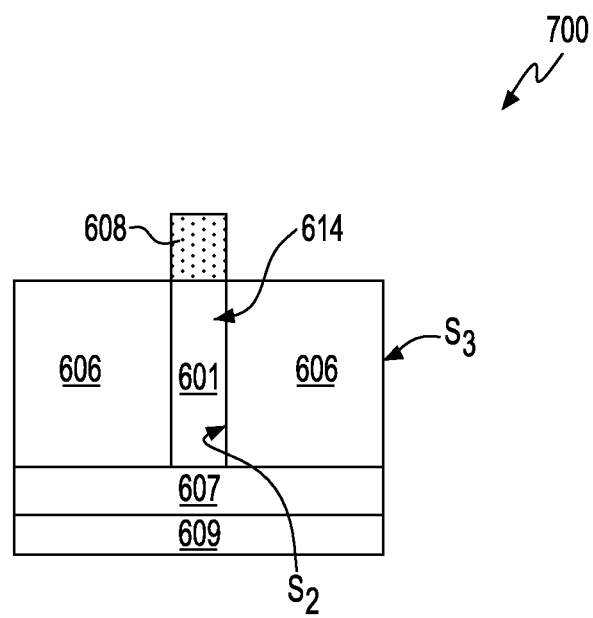
FIG. 20 is a side cross-sectional view along section line X-X of FIG. 19.

Referring to FIGS. 18-20, the functional gate conductor 606 is foamed in direct contact with the sidewall surface of the fin structure 601 that contains the channel region of the device. In one embodiment, the functional gate conductor 606 is formed using an epitaxial growth process. When the chemical reactants are controlled and the system parameters set correctly, the depositing atoms arrive at the sidewall surface of the fin structure 602 with sufficient energy to move around on the surface and orient themselves to the crystal arrangement of the atoms of the deposition surface. Therefore, the functional gate conductor 606 has the same crystalline orientation as the channel region of the fin structure 601.

In one embodiment, the functional gate conductor 606 is composed of silicon, such as single crystal silicon or polycrystalline silicon. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 450° C. to 900° C. Although higher temperature typically results in faster deposition, the faster deposition may result in crystal defects and film cracking. In one embodiment, the functional gate conductor 606 may be provided by epitaxial growth of SiGe. The Ge content of the epitaxial grown SiGe may range from 5% to 60%, by atomic weight %. In another embodiment, the Ge content of the epitaxial grown SiGe may range from 10% to 40%.

The functional gate conductor 606 is doped to a conductivity type that is opposite the conductivity type of the channel region 614 of the fin structure 601. Therefore, if the channel region 614 of the fin structure 601 is doped to an n-type conductivity, the functional gate conductor 606 is doped to a p-type conductivity. The dopant is introduced to the functional gate conductor 606 using an in-situ doping process. The dopant conductivity type and dopant concentration for the functional gate conductor 606 that is depicted in FIG. 19 is similar to the functional gate conductor 30 that is described above with reference to FIG. 4.

The dopant that provides the conductivity of the functional gate conductor 606 is uniform in concentration throughout the entirety of the functional gate conductor 606. Referring to FIG. 20, in one example, the dopant concentration at the surface S2 of the functional gate conductor 606 that is in direct contact with the channel region 614 of the fin structure 601 is equal to a dopant concentration at an opposite surface S3 of the functional gate conductor 606.

Further, in some embodiments, the epitaxially formed functional gate conductor 606 provides an abrupt junction at the interface between the functional gate conductor 606 and the channel region 614 of the fin structure 601. In one embodiment, the junction abruptness, i.e., dopant concentration change at the gate/channel junction, is less than 3 nm/decade. In another embodiment, the junction abruptness ranges from 2.5 nm/decade to 0.25 nm/decade. In yet another embodiment, the junction abruptness ranges from 2.0 nm/decade to 0.50 nm/decade. In one example, the junction abruptness is 2.0 nm/decade or less.

In one embodiment, the method depicted in FIGS. 14-20 depicts a finFET semiconductor device 700 that includes a fin structure 601 comprising first conductivity source and drain region 602 on opposing sides of a first conductivity channel region 614.

In one example, the first conductivity is provided by an n-type dopant. The first conductivity dopant in the source and drain regions 602 is present in a greater concentration than the concentration of the first conductivity dopant in the channel region 214. A gate conductor 606, i.e., functional gate conductor, comprised of an epitaxial semiconductor material is in direct contact with the channel region 214 of the fin structure 601. The epitaxial semiconductor material that provides the gate conductor 606 has the same crystal structure as the fin structure 601. The epitaxial semiconductor material includes a second conductivity dopant that is present in uniform concentration throughout an entirety of the gate conductor 606. In one embodiment, the second conductivity dopant may be provided by a p-type dopant.

Figure 21:
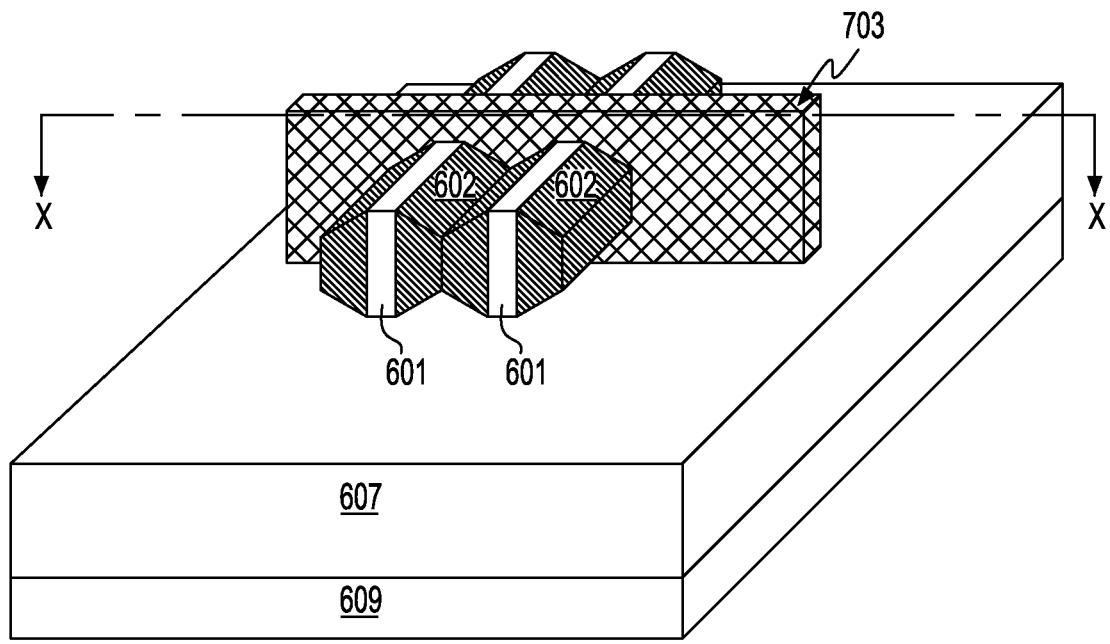
FIG. 21 is a perspective views depicting one embodiment of tri-gate semiconductor device formed in accordance with the present disclosure.
Figure 22:
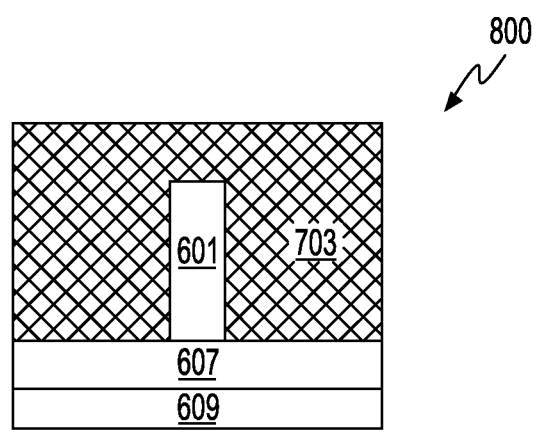
FIG. 22 is a side cross-sectional view along section line X-X of FIG. 21.

The method depicted in FIGS. 14-20 may also provide a tri-gate semiconductor device 800, as depicted in FIGS. 21-22. A tri-gate semiconductor device 800 is similar to a finFET semiconductor device. Referring to FIGS. 21-22, the tri-gate semiconductor device 800 differs from a finFET semiconductor device, because the functional epitaxially grown tri-gate 703 is in direct contact with the upper surface and sidewall surfaces of the fin structure 601 that contain the channel region 614. In a finFET semiconductor device 700, the dielectric fin cap 608 obstructs epitaxial growth on the upper surface of the fin structure 601. In a tri-gate semiconductor device 800, the upper surface of the fin structure 601 is exposed and allows for the functional epitaxially grown tri-gate 703 to be formed on the upper surface of the fin structure

601, in addition to the sidewall surfaces of the fin structure 601 that contains the channel region.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a junction field effect transistor (JFET) comprising:
    forming a replacement gate structure on a portion of a semiconductor substrate, wherein a source region and a drain region are formed in opposing sides of the portion of the semiconductor substrate that the replacement gate structure is formed on;
    forming a dielectric on the semiconductor substrate having an upper surface that is coplanar with an upper surface of the replacement gate structure;
    removing the replacement gate structure to provide an opening to an exposed portion of the semiconductor substrate; and
    epitaxially growing a functional gate conductor within the opening in direct contact with the exposed portion of the semiconductor substrate.

2. The method of claim 1, wherein the epitaxially growing of the functional gate conductor further comprises a semiconductor material that is doped to a p-type conductivity, wherein a p-type dopant is introduced to the semiconductor material in-situ during the epitaxially growing of the functional gate conductor, and wherein the dopant concentration of the p-type dopant is uniform throughout an entirety of the functional gate conductor.

3. The method of claim 2, wherein a dopant concentration at the base of the functional gate conductor that is in direct contact with the exposed portion of the semiconductor substrate is equal to a dopant concentration at an upper surface of the functional gate conductor.

4. The method of claim 1, wherein the source region and the drain region are doped to an n-type conductivity, and a channel region of the semiconductor substrate present between the source region and the drain region is doped to an n-type conductivity, wherein the dopant concentration of the source region and the drain region is greater than the dopant concentration of the channel region.

5. The method of claim 1, wherein the semiconductor substrate is a semiconductor on insulator (SOI) substrate, wherein a semiconductor on insulator layer (SOI) layer contains at least the channel region and has a thickness of less than 10 nm.

6. The method of claim 1, wherein the semiconductor substrate is a semiconductor on insulator (SOI), wherein a semiconductor on insulator layer (SOI) layer contains at least the channel region and has a thickness greater than 10 nm, or the semiconductor substrate is a bulk semiconductor substrate, and a channel region of the semiconductor substrate that is in direct contact with the gate conductor includes a p-type well region underlying an n-type channel portion.

7. The method of claim 1, wherein a spacer is formed on a sidewall of the replacement gate structure prior to the forming of the dielectric, or the spacer is formed after on a sidewall of the dielectric after the replacement gate structure is removed and before the gate dielectric layer is formed.

8. The method of claim 1, wherein the removing of the replacement gate structure to provide an opening to the exposed portion of the semiconductor substrate comprises an etch that removes the replacement gate structure selective to the dielectric and the exposed portion of the semiconductor substrate.

9. The method of claim 1, wherein epitaxially growing the functional gate conductor within the opening in direct contact with the exposed portion of the semiconductor substrate comprises a silicon source comprising at least one of silicon tetrachloride, dichlorosilane ($SiH_2Cl_2$), silane ($SiH_4$), or a combination thereof, wherein a temperature for the epitaxially growing the functional gate conductor ranges from 450° C. to 900° C.

10. The method of claim 1, wherein a difference between a highest dopant concentration and a lowest dopant concentration in the functional gate conductor is less than 10% when measured by secondary ion mass spectrometry (SIMS).

11. The method of claim 1, wherein the epitaxially growing of the functional gate conductor provides an abrupt junction at a gate/channel junction having an abruptness of 3 nm/decade.

12. A method of fabricating a semiconductor device comprising:
    forming a first replacement gate structure on a first portion of a semiconductor substrate and a second replacement gate structure of a second portion on the semiconductor substrate, wherein a first source region and a first drain region are formed in opposing sides of the portion of the semiconductor substrate that the first replacement gate structure is formed on, and a second source region and a second drain region are formed in opposing sides of the portion of the semiconductor substrate that the second replacement gate structure is formed on;
    forming a dielectric on the semiconductor substrate having an upper surface that is coplanar with an upper surface of the first replacement gate structure and the second replacement gate structure;
    removing the first replacement gate structure to provide a first opening to an exposed portion of the first portion of the semiconductor substrate;
    epitaxially growing a functional gate conductor within the first opening in direct contact with the exposed portion of the semiconductor substrate to provide a junction field effect transistor in the first portion of the semiconductor substrate;
    removing the second replacement gate structure to provide a second opening to an exposed portion of the second portion of the semiconductor substrate; and
    forming a functional gate structure including a gate dielectric in direct contact with the exposed portion of the second portion of the semiconductor substrate to provide a metal oxide semiconductor field effect transistor (MOSFET) in the second portion of the semiconductor substrate.

13. A method of fabricating a junction field effect transistor (JFET) comprising:
    forming a replacement gate structure on a portion of a semiconductor substrate, wherein a source region and a drain region are formed in opposing sides of the portion of the semiconductor substrate that the replacement gate structure is formed on;
    forming a dielectric on the semiconductor substrate having an upper surface that is coplanar with an upper surface of the replacement gate structure;
    removing the replacement gate structure to provide an opening to an exposed portion of the semiconductor substrate; and epitaxially growing a functional gate conductor within the opening in direct contact with the exposed portion of the semiconductor substrate, wherein the functional gate conductor has a substantially uniform doping concentration through an entirety of the functional gate conductor so that a dopant concentration at the base of the functional gate conductor that is in direct contact with the exposed portion of the semiconductor substrate is substantially equal to a dopant concentration at an upper surface of the functional gate conductor.

14. The method of claim 13, wherein the epitaxially growing of the functional gate conductor further comprises a semiconductor material that is doped to a p-type conductivity, wherein a p-type dopant is introduced to the semiconductor material in-situ during the epitaxially growing of the functional gate conductor.

15. The method of claim 13, wherein the source region and the drain region are doped to an n-type conductivity, and a channel region of the semiconductor substrate present between the source region and the drain region is doped to an n-type conductivity, wherein the dopant concentration of the source region and the drain region is greater than the dopant concentration of the channel region.

16. The method of claim 13, wherein the semiconductor substrate is a semiconductor on insulator (SOI) substrate, wherein a semiconductor on insulator layer (SOI) layer contains at least the channel region and has a thickness of less than 10 nm.

17. The method of claim 13, wherein the semiconductor substrate is a semiconductor on insulator (SOD, wherein a semiconductor on insulator layer (SOI) layer contains at least the channel region and has a thickness greater than 10 nm, or the semiconductor substrate is a bulk semiconductor substrate, and a channel region of the semiconductor substrate that is in direct contact with the gate conductor includes a p-type well region underlying an n-type channel portion.

18. The method of claim 13, wherein a spacer is formed on a sidewall of the replacement gate structure prior to the forming of the dielectric, or the spacer is formed after on a sidewall of the dielectric after the replacement gate structure is removed and before the gate dielectric layer is formed.

19. The method of claim 13, wherein the removing of the replacement gate structure to provide an opening to the exposed portion of the semiconductor substrate comprises an etch that removes the replacement gate structure selective to the dielectric and the exposed portion of the semiconductor substrate.

20. The method of claim 13, wherein the epitaxially growing the functional gate conductor within the opening in direct contact with the exposed portion of the semiconductor substrate comprises a silicon source comprising at least one of silicon tetrachloride, dichlorosilane ($SiH_2Cl_2$), silane ($SiH_4$), or a combination thereof, wherein a temperature for the epitaxially growing the functional gate conductor ranges from 450° C. to 900° C.

21. The method of claim 13, wherein a difference between a highest dopant concentration and a lowest dopant concentration in the functional gate conductor is less than 10% when measured by secondary ion mass spectrometry (SIMS).

22. The method of claim 13, wherein the epitaxially growing of the functional gate conductor provides an abrupt junction at a gate/channel junction having an abruptness of 3 nm/decade.

* * * * *